(12) United States Patent
Fukuhara et al.

(10) Patent No.: US 10,670,636 B2
(45) Date of Patent: Jun. 2, 2020

(54) CURRENT DETECTION DEVICE

(71) Applicant: Yazaki Corporation, Tokyo (JP)

(72) Inventors: Toshiaki Fukuhara, Makinohara (JP); Makoto Sei, Makinohara (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 56 days.

(21) Appl. No.: 16/021,440

(22) Filed: Jun. 28, 2018

(65) Prior Publication Data

US 2019/0025350 A1    Jan. 24, 2019

(30) Foreign Application Priority Data

Jul. 18, 2017  (JP) .................................. 2017-138789

(51) Int. Cl.
| | | |
|---|---|---|
| *G01R 15/20* | (2006.01) | |
| *G01R 33/07* | (2006.01) | |
| *H01M 10/48* | (2006.01) | |
| *H01R 13/639* | (2006.01) | |
| *H01R 13/66* | (2006.01) | |
| *G01R 31/364* | (2019.01) | |
| *G01R 19/00* | (2006.01) | |

(52) U.S. Cl.
CPC ........... *G01R 15/207* (2013.01); *G01R 33/07* (2013.01); *H01M 10/48* (2013.01); *H01R 13/639* (2013.01); *G01R 19/0092* (2013.01); *G01R 31/364* (2019.01); *H01R 13/6683* (2013.01)

(58) Field of Classification Search
None
See application file for complete search history.

(56) References Cited

U.S. PATENT DOCUMENTS

| | | |
|---|---|---|
| 2011/0148407 A1 | 6/2011 | Kawaguchi et al. |
| 2014/0239947 A1* | 8/2014 | Nakajima .............. G01R 15/20 324/251 |
| 2015/0276814 A1 | 10/2015 | Nakajima |

FOREIGN PATENT DOCUMENTS

| | | |
|---|---|---|
| JP | 2010-14477 A | 1/2010 |
| JP | 2010-164517 A | 7/2010 |
| JP | 2014-85277 A | 5/2014 |

* cited by examiner

*Primary Examiner* — Jas A Sanghera
(74) *Attorney, Agent, or Firm* — Sughrue Mion, PLLC

(57) ABSTRACT

Provided is a current detection device capable of reducing manufacturing cost. A current detection device 1 includes a plate-like bus bar, a printed circuit board on which a magnetic field detecting element is mounted, a magnetic member, and a housing holding these components. The bus bar can be assembled into the housing by sliding in its longitudinal direction. The housing includes a first rib pressing the bus bar to restrict a movement in a thickness direction of the bus bar, a second rib pressing the bus bar to restrict a movement in a width direction of the bus bar, and a retaining protrusion fitting into a cutout portion provided at both sides in a width direction of the bus bar so as to retain the bus bar in a longitudinal direction of the bus bar.

5 Claims, 22 Drawing Sheets

CURRENT DETECTION DEVICE

TECHNICAL FIELD

The present invention relates to a current detection device including a bus bar.

BACKGROUND ART

There is a structure shown in FIGS. 24 to 26 as an example of a conventionally known current detection device. The current detection device 301 includes a bus bar 302, a printed circuit board 330 on which a Hall element is mounted, a magnetic member 304 for concentrating the magnetic flux, and a housing 305 for holding these components. The current detection device 301 detects a current value flowing through the bus bar 302 in such a manner that when a current flows in the bus bar 302 and a magnetic field is generated around, the Hall element outputs a voltage corresponding to a strength of the magnetic field (for example, refer to Patent Document 1).

The current detection device 301 fixes a bus bar 302 and the magnetic member 304 in such a manner that the printed circuit board 330, the bus bar 302 and the magnetic member 304 are in order assembled to the housing 305 before by thermally-welding the retaining portions 351 and 352 provided on the housing 305.

The retaining portion 351 is a portion for fixing the bus bar 302, and before the thermal welding is, as indicated by a one-dot chain line in FIG. 26, formed in a cylindrical shape with a smaller diameter than a round hole 320 formed through the bus bar 302. The retaining portion 351 fixes the bus bar 302 by passing through the round hole 320 and heating and pressing so that a distal end portion becomes a shape with a larger diameter than the round hole 320 as shown by a solid line in FIG. 26.

The retaining portion 352 is a portion for fixing the magnetic member 304 and before thermal welding is, as shown by a one-dot chain line in FIG. 26, formed in a plate shape extending in a height direction of the housing 305. The retaining portion 352 is heated and bent at a right angle, whereby the magnetic member 304 presses a bottom plate portion of the member 304 and fixes the magnetic member 304.

PATENT DOCUMENT

Patent Document 1: Japanese Patent Application Laid-Open No. 2010-164517

DISCLOSURE OF THE INVENTION

Problems to be Solved by the Invention

Because the above-described conventional current detection device 301 had a structure where thermal welding of the retaining portion 351 fixes the bus bar 302 to the housing 305, welding equipment and welding head were necessary, resulting in an increase in manufacturing cost.

It is therefore an object of the present invention to provide a current detection device capable of reducing the manufacturing cost.

Means for Solving the Problems

In order to solve the above problem, the current detection device of the present invention includes a plate-like bus bar, a magnetic field detecting element for detecting magnetic field generated by a current flowing through the bus bar, a magnetic member, and a housing holding these components, and the housing includes a first rib configured to press the bus bar to restrict a movement in a thickness direction of the bus bar, a second rib configured to press the bus bar to restrict a movement in a width direction of the bus bar, and a retaining portion configured to retain the bus bar in a longitudinal direction of the bus bar by engaging with the bus bar.

Advantages of the Invention

According to the present invention, since the housing includes the first rib restricting movement of the bus bar in the thickness direction, the second rib restricting movement of the bus bar in the width direction, and the retaining portion retaining the bus bar in the longitudinal direction of the bus bar by engaging with the bus bar, a conventional retaining portion retaining the bus bar by thermal welding can be eliminated and the manufacturing cost of the current detection device can be reduced.

MODE FOR CARRYING OUT THE INVENTION

Figure 1:
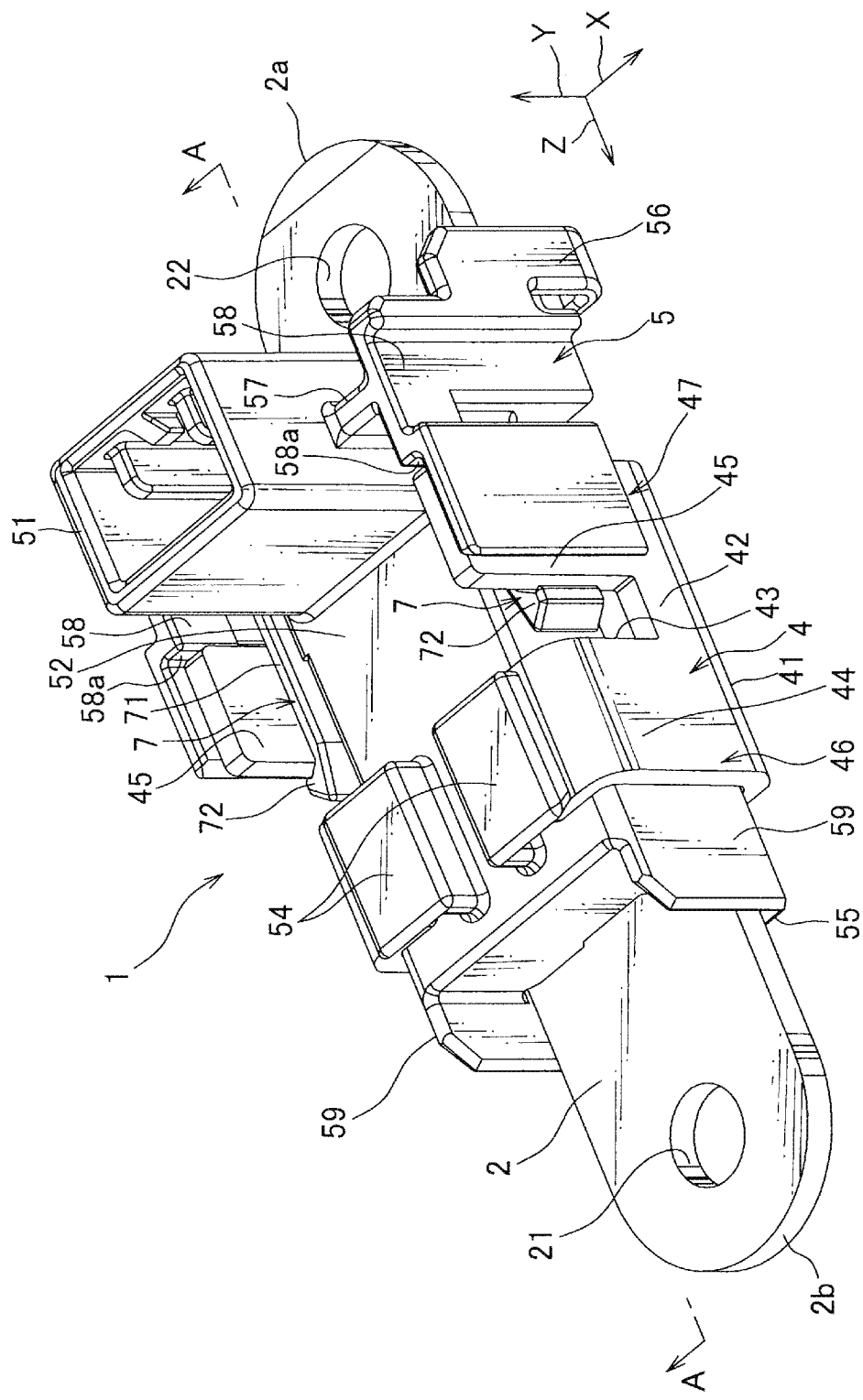
FIG. 1 is a perspective view of a current detection device according to a first embodiment of the present invention.

The current detection device according to a first embodiment of the present invention will be described with reference to FIGS. 1 to 14.

The current detection device 1 shown in FIGS. 1 to 14 is a device for detecting a current flowing between a vehicle-mounted power supply (for example, a battery) and an electric equipment (for example, a motor). The current detection device 1 includes a strip-shaped bus bar 2, a printed circuit board 30 on which the two magnetic field detecting elements 31 and 32 are mounted, a magnetic member 4, and a housing 5 holding these components while insulating them from each other.

Figure 7:
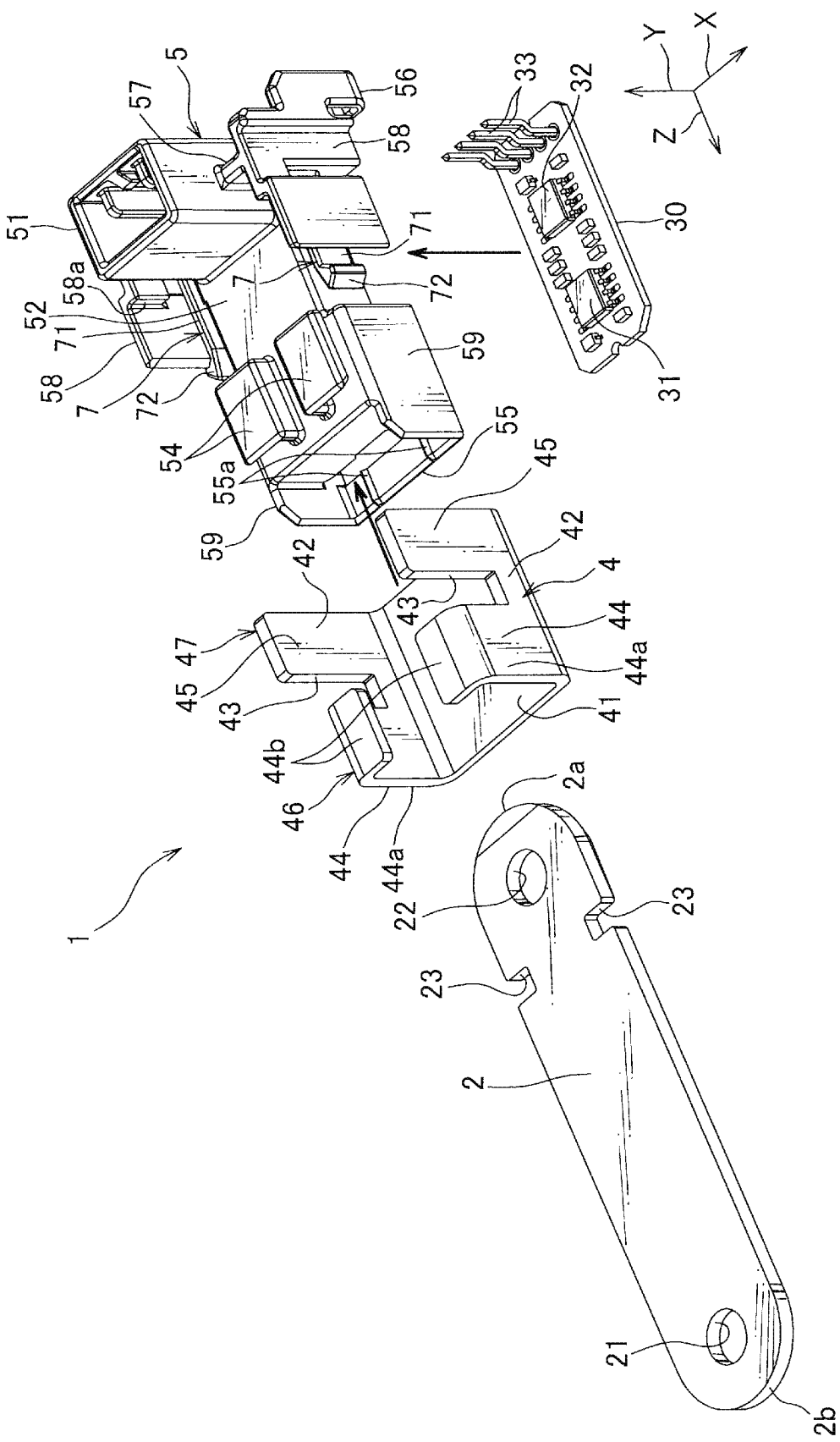
FIG. 7 is an exploded view of the current detection device of FIG. 1.
Figure 8:
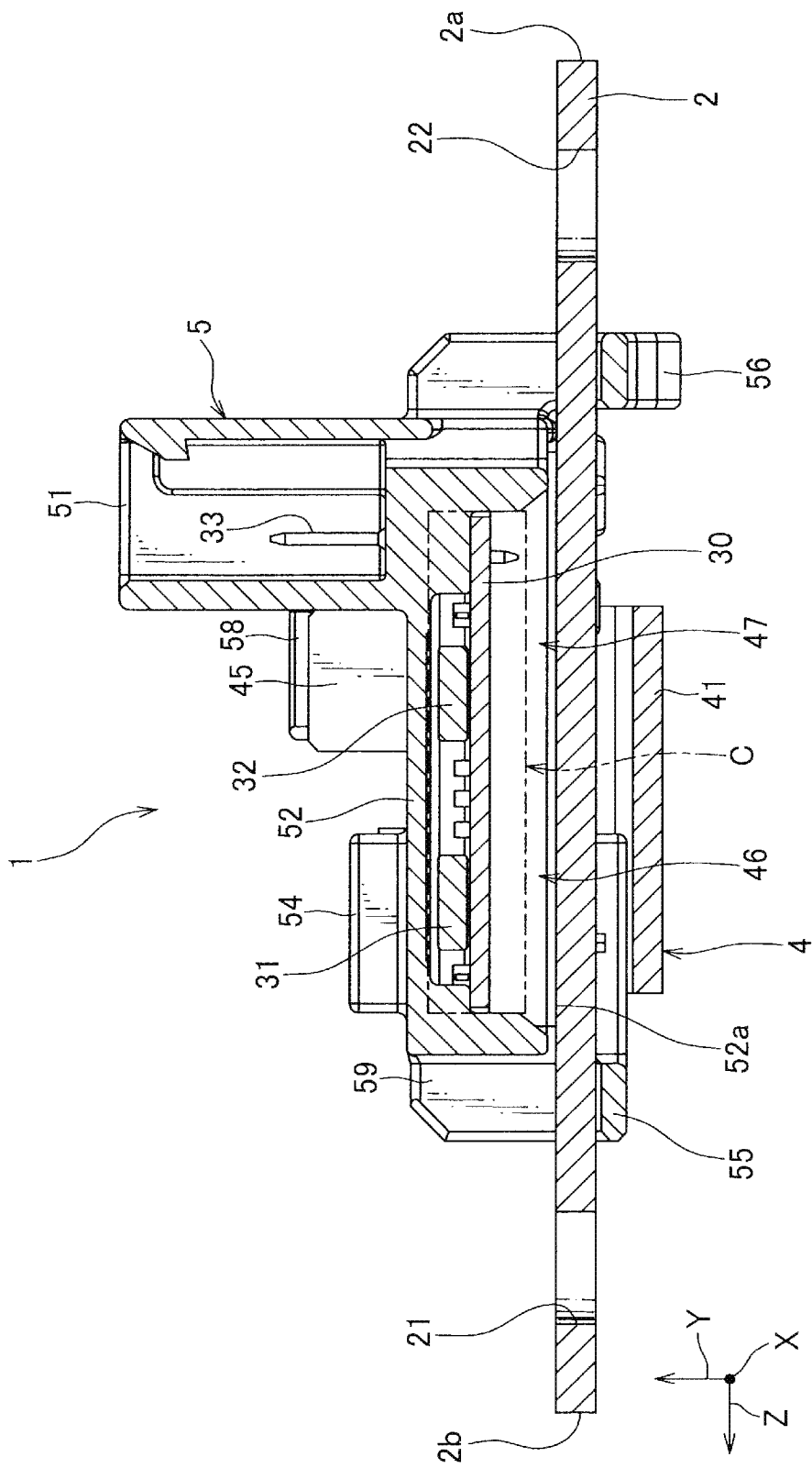
FIG. 8 is a cross-sectional view taken along the line A-A in FIG. 1.

In FIGS. 1 to 14, an arrow X is parallel to a width direction of the bus bar 2, an arrow Y is parallel to a thickness direction of the bus bar 2, and an arrow Z is parallel to a longitudinal direction of the bus bar 2. As shown in FIG. 8, the bus bar 2, the printed circuit board 30, and a bottom plate part 41 (described later) of the magnetic member 4 are arranged opposite each other at an interval in the direction of the arrow Y. Also, the bus bar 2, the printed circuit board 30, and the magnetic member 4 are not in contact with each other.

In the current detection device 1 of the specification, with reference to the bus bar 2, a side on which the printed circuit board 30 is placed is defined as an upper side, and a side on which the bottom plate part 41 is placed is defined as a lower side. Also, "upper side" and "lower side" in the specification may not agree with actual upper side and lower side when the current detection device 1 is used.

The bus bar 2 is made of a conductive metal such as copper or aluminum. Both ends of the bus bar 2 in the longitudinal direction have connection holes 21 and 22 having circular shape in a plan view formed penetrating therethrough. The both ends of the bus bar 2 where these connection holes 21, 22 are formed are electrically respectively connected with a power supply and an electric equipment, directly or via an electric wire etc.

Both side end faces of the bus bar 2 in the width direction are formed in parallel to each other. Both end faces in the longitudinal direction of the bus bar 2, that is, the end face 2a on the connection hole 22 side of the bus bar 2 and the end face 2b on the connection hole 21 side are each formed in a semicircular shape in a plan view. As shown in FIG. 7, the bus bar 2 is assembled to the housing 5 by sliding from the end face 2a along its longitudinal direction. Hereinafter, the end face 2a is referred to as a front end face 2a, and the end face 2b as a rear end face 2b.

In the current detection device 1 of the specification, the front end face 2a side of the bus bar 2 is defined as a front side, and the rear end face 2b side of the bar 2 is defined as a rear side. Further, in the specification, "front side" and "rear side" may not match the actual front side and the rear side when the flow detection device 1 is used.

On both widthwise end portions of the bus bar 2 on the side of the front end face 2a, cutout portions 23 each having a rectangular shape in a plan view are provided. These cutout portions 23 allow each retaining protrusion 8 (described later) of the housing 5 to fit in.

The printed circuit board 30 is formed in a rectangular plate shape. The two magnetic field detecting elements 31, 32 are mounted on the same face (the upper face in this embodiment) of the printed circuit board 30. Also, the two magnetic field detecting elements 31, 32 are arranged with a space in the longitudinal direction of the printed circuit board 30. In addition, a plurality of pin-like terminals 33 is electrically connected to the printed circuit board 30. The plurality of pin-like terminals 33 is arranged in the connector connecting portion 51 of the housing 5 described later.

In the present embodiment, the magnetic field detecting elements 31 and 32 are Hall elements, detecting strength of the magnetic field where they are arranged. That is, by applying a voltage under the magnetic field generated by current flowing in the bus bar 2, the magnetic field detecting elements 31, 32 output a voltage responsive to the strength of the magnetic field. In the present embodiment, the same magnetic field detecting elements 31, 32 are used.

The magnetic member 4 is made of a ferromagnetic material such as iron, and magnetic permeability thereof is higher than that of other components of the current detection device 1, and the magnetic flux preferentially passes. The magnetic member 4 is obtained by pressing one plate material or the like, and integrally includes a plate-like bottom plate portion 41 and a pair of standing wall portions 42 respectively erected from the widthwise end portions of the bottom plate portion 41. The pair of standing wall portions 42 positions therebetween the bus bar 2 and the magnetic field detecting elements 31, 32. The bottom plate portion 41 is arranged in such a manner that its upper face faces the lower face of the bus bar 2.

As shown in FIG. 7, the standing wall portion 42 includes a cutout portion 43 extending from a tip in the height direction toward the bottom plate portion 41. Therefore, the standing wall portion 42 is divided by the cutout portion 43 into a first portion 44 and a second portion 45. The first portion 44 is bent to face the bottom plate portion 41. A portion of the first portion 44 perpendicular to the bottom plate portion 41 is referred to as a "low wall portion" and is denoted by reference numeral 44a. A portion of the first portion 44 that faces the bottom plate portion 41 is referred to as "opposing plate portion" and is denoted by reference numeral 44b. The distal ends of the opposing plate portions 44b of the pair of standing wall portions 42 are spaced apart from each other. The second portion 45 has a height dimension (a dimension in the Y direction) larger than the low wall portion 44a. Hereinafter, the second portion 45 is referred to as a high wall portion 45.

As shown in FIG. 7, the magnetic member 4 is assembled to the housing 5 by sliding along a face direction of the bottom plate portion 41 from the side of the high wall portion 45.

In such magnetic member 4, a closed portion 46 having a C-shaped cross portion (C shape as seen in the direction of the arrow Z) is constituted by the bottom plate portion 41, the pair of low wall portions 44a, and the pair of opposing plate portions 44b, and opening portion 47 having a U-shaped cross portion (U shape as seen in the direction of the arrow Z) is constituted by the plate portion 41 and the pair of high wall portions 45. When a current flows in the bus bar 2 and a magnetic field is generated, magnetic flux tends to concentrate in the closing portion 46. Further, in the opening portion 47, the magnetic flux is difficult to concentrate as compared with the closing portion 46. Therefore, the inside of the closed portion 46 has a stronger magnetic field than the inside of the opening portion 47. The magnetic field detecting element 31 is disposed inside the closed portion 46, and the magnetic field detecting element 32 is disposed inside the opening portion 47.

With such an arrangement, when a large current flows through the bus bar 2, the magnetic field is not strengthened at the opening portion 47 as compared with the closed portion 46, and the magnetic field can be detected by the magnetic field detection element 32 disposed at the opening portion 47. Further, when a small current flows through the bus bar 2, the magnetic field becomes stronger at the closed portion 46 as compared with the opening portion 47, and therefore, the small current can be detected by the magnetic field detecting element 31 disposed at the closed portion 46.

That is, the current detection device 1 is made such that in order to be able to detect a wide range of current values using the magnetic field detecting elements 31, 32 having the same configuration (the range of detectable magnetic flux densities is the same), by devising the shape of the magnetic member 4, any of the magnetic flux density at the closing portion 46 when the small current flows and the magnetic flux density at the opening portion 47 when a large current flows are included in a detectable range of the magnetic field detecting elements 31 and 32.

The housing 5 is made of an insulating synthetic resin, and integrally includes a board accommodating portion 52, a connector connecting portion 51, a magnetic member holding section, and a bus bar holding section.

The board accommodating portion 52 is formed in a box shape opened downward. The printed circuit board 30 is, as shown by the arrow in FIG. 7, accommodated from below in the board accommodating portion 52, and is held in the board accommodating portion 52 by filling mold material in the board accommodating portion 52. The part C in FIG. 8 shows a range which is filled with mold material.

The connector connecting portion 51 is continuous with the upper face on the front side of the board accommodating portion 52 and is formed in a tubular shape opened upward. On the inner side of the connector connecting portion 51, the plurality of pin-like terminals 33 is arranged. The connector connecting portion 51 is connected to an appropriate connector so that measured values of the magnetic field detecting elements 31 and 32 are externally outputted.

The magnetic member holding section holds the magnetic member 4 in the X direction, the Y direction and the Z direction with respect to the housing 5 so as not to move to either direction. The magnetic member holding section includes a pair of abutment faces 58a each abutting against the end face on the opposite side (front side) to the cutout portion 43 of the high wall portions 45, a pair of locking arms 7 for preventing removal of the magnetic member 4, and a pair of pressing portions 54a pressing the pair of opposing plate portions 44b against the bottom plate portion 41 side.

Figure 2:
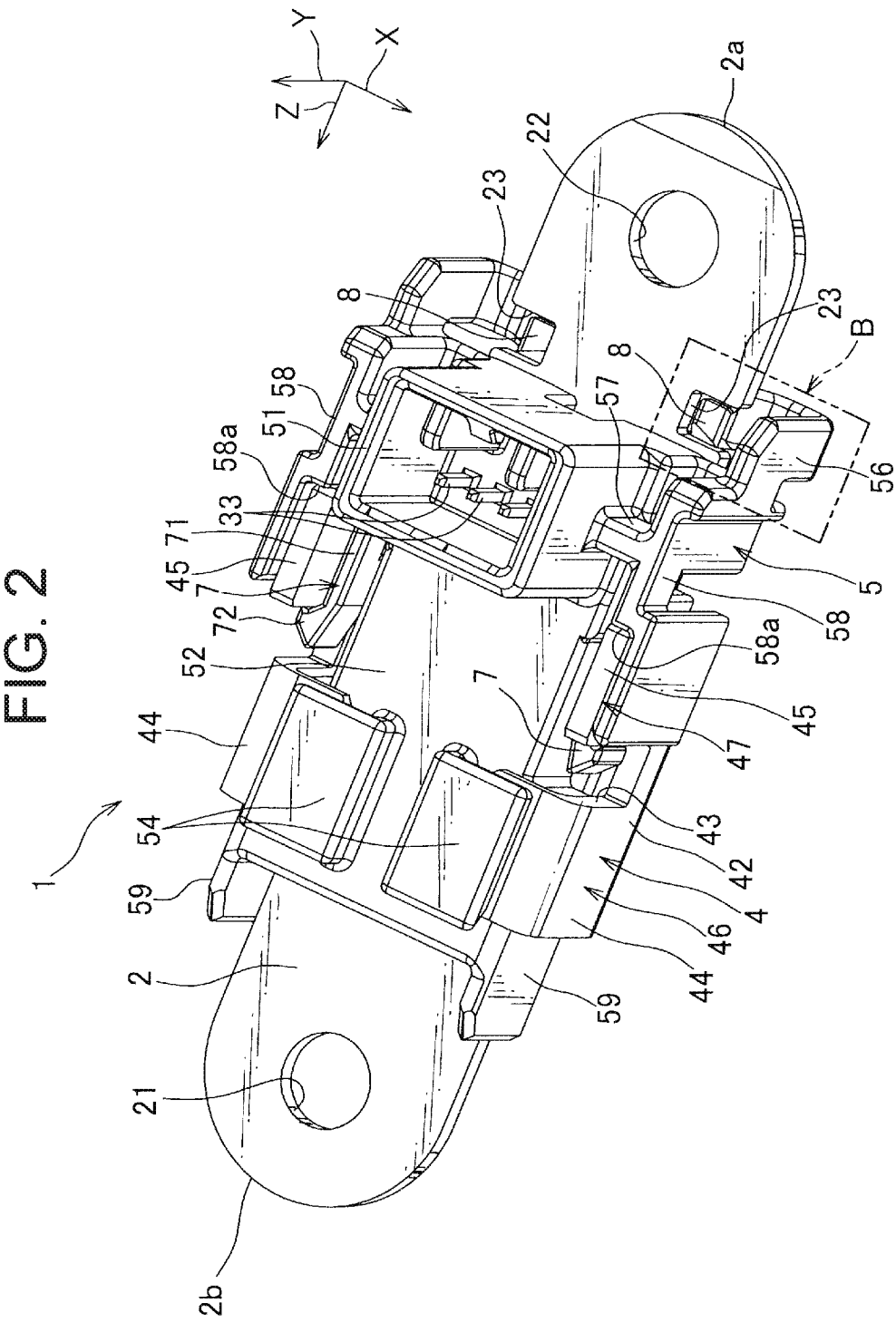
FIG. 2 is a perspective view of the current detection device of FIG. 1 as viewed from another angle.
Figure 11:
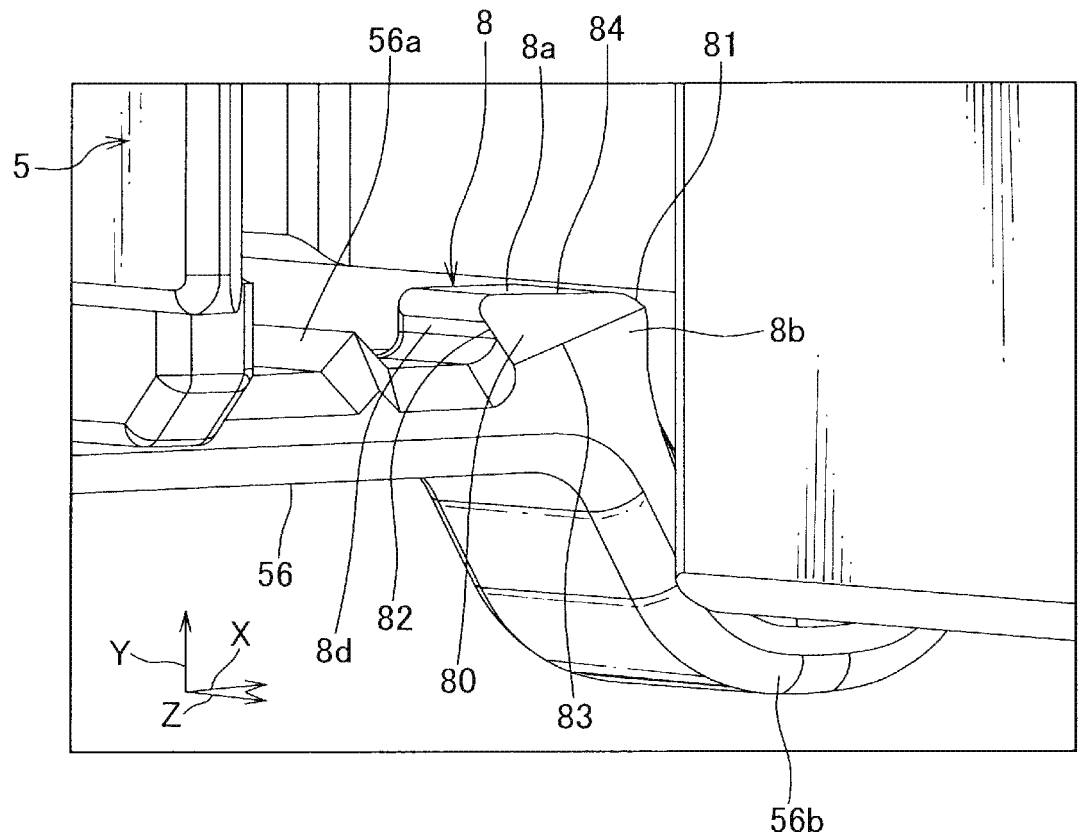
FIG. 11 is a perspective view of the retaining protruding portion of FIG. 10 viewed from another angle.

As shown in FIGS. 1, 2, 11 and the like, the pair of abutment faces 58a is provided with a pair of walls 58 for positioning the connector connecting portion 51 and the board accommodating portion 52 therebetween. Also, each wall 58 is connected to the side face of the connector connecting portion 51 and the board accommodating portion 52 by a connecting portion 57.

Figure 4:
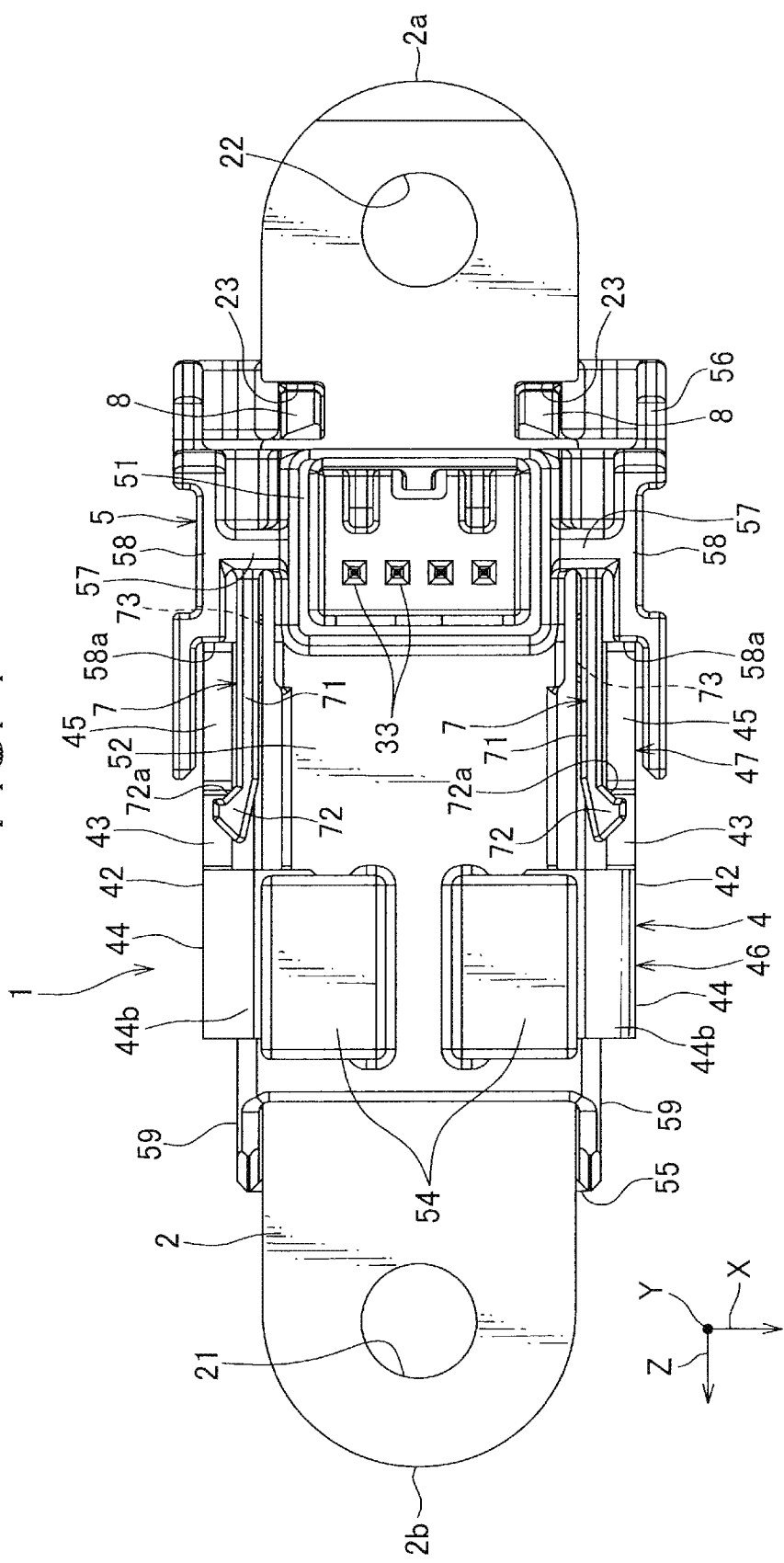
FIG. 4 is a plan view of the current detection device of FIG. 1.
Figure 14:
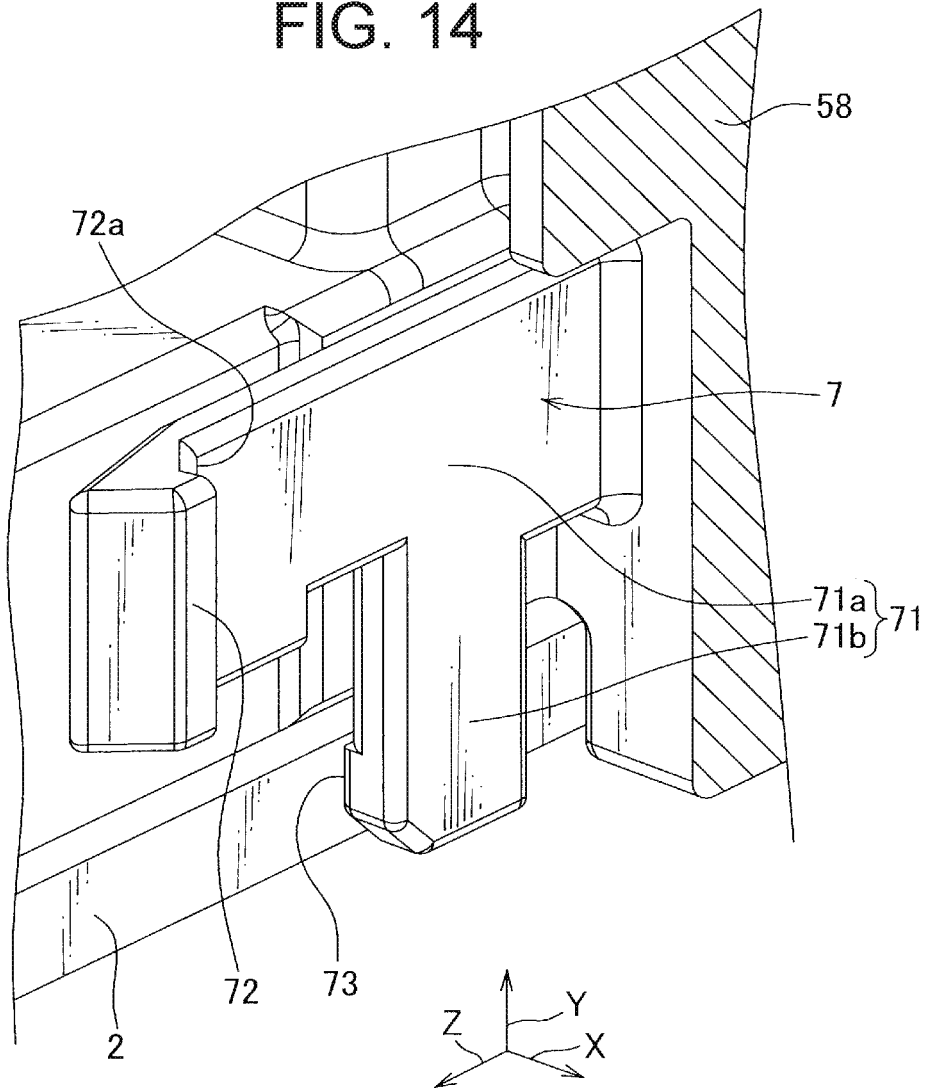
FIG. 14 is a view for explaining a configuration of a locking arm provided in the housing of FIG. 1.

As shown in FIGS. 4, 14 and the like, the pair of locking arms 7 respectively include an arm portion 71 that is arranged between the standing wall portion 42 and the bus bar 2 and is elastically deformable in the opposing direction of the standing wall portions 42, a locking portion 72 that protrudes from a distal end of the arm portion 71 and locks on the standing wall portion 42, and a protruding portion 73 that protrudes from the arm portion 71 and contacts the side end face in the width direction of the bus bar 2.

In the present embodiment, the arm portion 71 is constituted by an extended horizontal portion 71a formed like a cantilever plate in the direction of the arrow Z (rear side) from the connecting portion 57, and a hanging portion 71b descending from an intermediate portion of the horizontal portion 71a. The locking portion 72 protrudes from a distal end (rear end) of the horizontal portion 71a away from the connecting portion 57 toward the outside of the housing 5. In the present embodiment, the locking portion 72 locks on the cutout portion 43. The protruding portion 73 extends from the lower end of the hanging portion 71b away from the horizontal portion 71a to the inside of the housing 5.

Further, the locking portion 72 is provided with a contact face 72a forming an obtuse angle with the horizontal portion 71a. The contact face 72a contacts an inner edge portion of the cutout portion 43, that is, an edge of the rear end of the high wall portion 45, and presses the edge to the outer side in the width direction of the housing 5 and the side of the contact face 58a (front side), so as to fix the magnetic member 4 not to move with respect to the housing 5 in two directions of the X direction and the Z direction.

Assembling of the magnetic member 4 to the housing 5 is performed before the assembly of the bus bar 2. When the magnetic member 4 is slid at the time of assembly, the high wall portion 45 hits the locking portion 72, so as to bend the arm portion 71 inward in the width direction of the housing 5. Then, when the high wall portion 45 passes the locking portion 72 and comes into contact with the contact face 58a, the deflection of the arm portion 71 is restored and the locking portion 72 is engaged with the cutout portion 43. In this state, as described above, the contact face 72a contacts the edge of the high wall portion 45.

Thereafter, the bus bar 2 is slidably inserted between the pair of locking arms 7, and the bus bar 2 is assembled in the housing 5. When the bus bar 2 is slidably inserted between the pair of locking arms 7, the bus bar 2 hits the protruding portion 73 and slightly expands a space between the pair of locking arms 7. It follows from this that the contact face 72a of the locking portion 72 is moved to the outside in the width direction of the housing 5 to reliably contact the edge of the high wall portion 45.

In a state where the magnetic member 4 and the bus bar 2 are assembled to the housing 5, the bus bar 2 is located between the pair of locking arms 7, and the side end face of the bus bar 2 is in contact with the protruding portion 73 of each locking arm 7, so that deflection of the arm portion 71 inward is restricted. As a result, it is prevented that the locking portion 72 is released so that the magnetic member 4 is detached from the housing 5.

The above-described hanging portion 71b and the protruding portion 73 are not indispensable, and it may be configured that the horizontal portion 71a abuts against the side end face in the width direction of the bus bar 2. In the present embodiment, providing the hanging portion 71b and the protruding portion 73 can reduce an ill effect that the horizontal portion 71a suffers when the housing 5 thermally expands under a high temperature environment.

Figure 5:
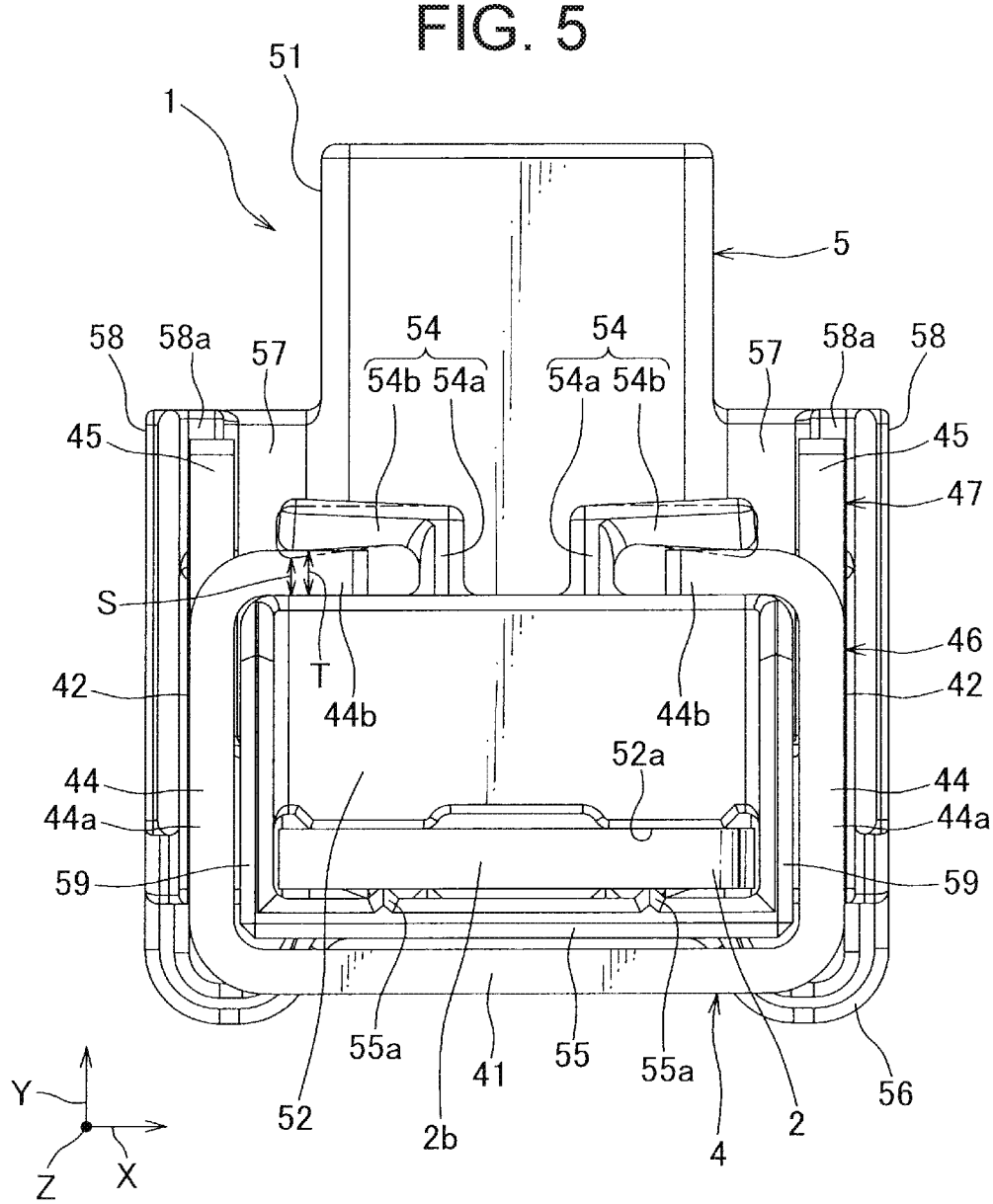
FIG. 5 is a rear view of the current detection device of FIG. 1.

As shown in FIG. 5, each of the pair of pressing portions 54 is constituted by a base part 54a erected from the upper face on the rear side of the board accommodating portion 52, and a plate part 54b extending outward in the width direction of the housing 5 from the upper end of the base part 54a. The pressing portion 54 is in a natural state (indicated by a chain line in FIG. 5), a distance S between the plate portion 54b and the upper face of the board accommodating portion 52 is formed narrower than the plate thickness T of the opposing plate portion 44b. Such a pressing portion 54 presses the opposing plate portion 44b positioned between the plate portion 54b and the upper face of the board accommodating portion 52 toward the upper face side of the board accommodating portion 52 (that is, the bottom plate portion 41 side) by the plate portion 54b, so as to hold the magnetic member 4 not to move with respect to the housing 5 in the Y direction.

The bus bar holding section holds the bus bar 2 in the X direction, the Y direction and the Z direction with respect to the housing 5. The bus bar holding section includes eight ribs 55a, 56a, 58b, 59a for pressing the lower face and the side end face of the bus bar 2, and a pair of retaining protrusions 8 fitting in the cutout portions 23, respectively.

Figure 3:
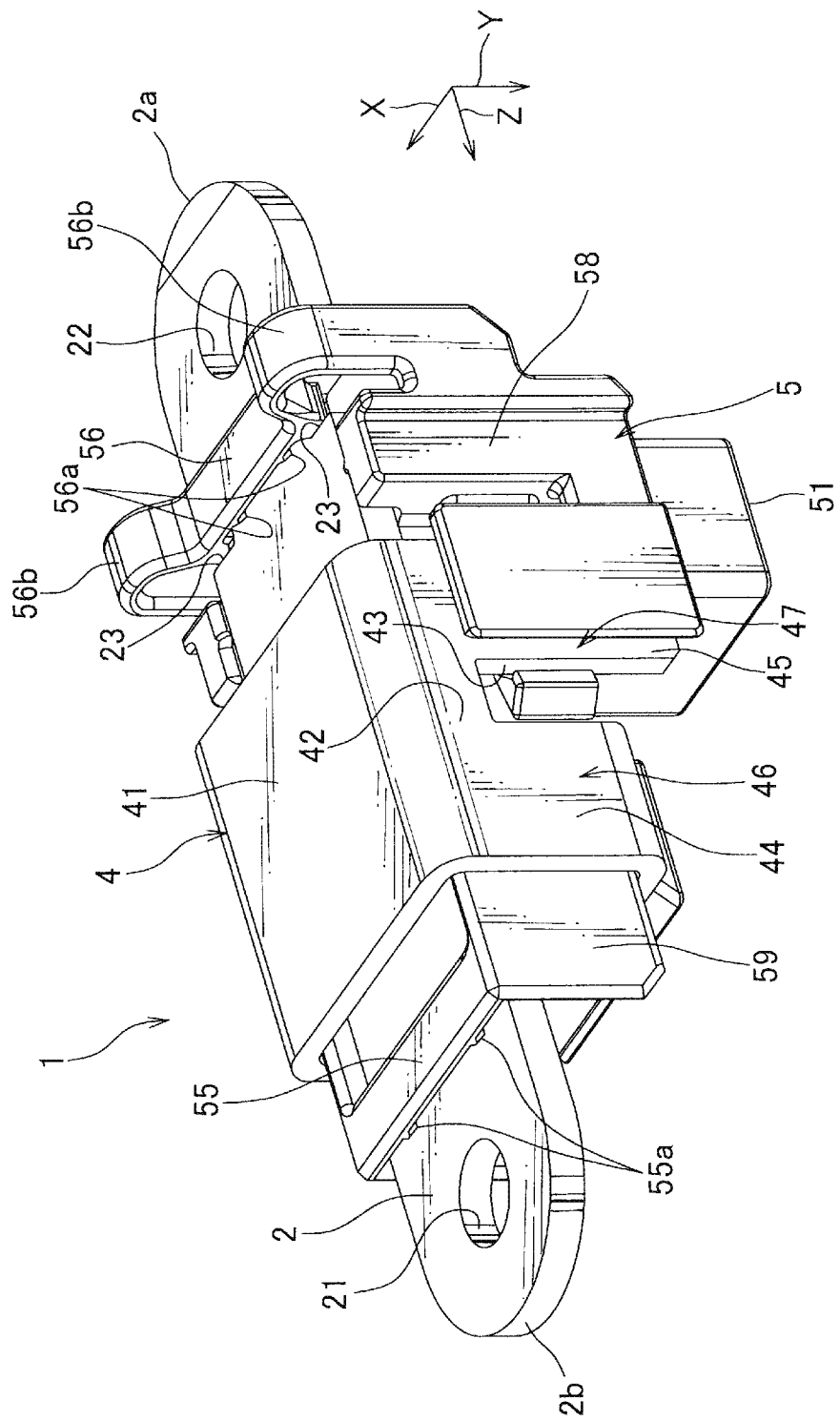
FIG. 3 is a perspective view of the current detection device of FIG. 1 as viewed from a bottom face side.

The housing 5 includes a pair of rear end walls 59 and a bridge portion 55 connecting the pair of rear end walls 59, and the rib 55a is, as shown in FIGS. 3, 5, 11, etc., provided at the bridge portion 55.

The pair of rear end walls 59 are walls respectively in continuation with the side facing the board accommodating portion 52 in the width direction (arrow X direction), extending further downward from the lower end 52a of the side face and extending further to the rear side beyond the rear end of the side face. The pair of rear end walls 59 follows along both side end faces of the bus bar 2 in the width direction.

The bridge portion 55 is a plate-like portion connecting the rear end and the lower end of the pair of rear end walls 59 to each other. The bridge portion 55 is located at the rear end of the housing 5. The bridge portion 55 follows along the lower face in the vicinity of the connection hole 21 of the bus bar 2.

The rib 55a extends in the direction of the arrow Z and is formed in a triangular cross portion with a sharp peak. Further, the pair of ribs 55a is provided at the bridge portion 55. The pair of ribs 55a extends parallel to each other with an interval in the direction of the arrow X. As shown in FIG. 5, the pair of ribs 55a contacts the lower face of the bus bar 2 inserted between the lower end 52a of the board accommodating portion 52 and the bridge portion 55, and presses the bus bar 2 toward the lower end 52a of the board accommodating portion 52.

The housing 5 includes a bridge portion 56 connecting the pair of walls 58 described above, and as shown in FIGS. 3, 6, 11 and the like, the rib 56a is provided at the bridge portion 56. The bridge portion 56 is located at the front end of the housing 5. The bridge portion 56 follows along the lower face near the connection hole 22.

Figure 6:
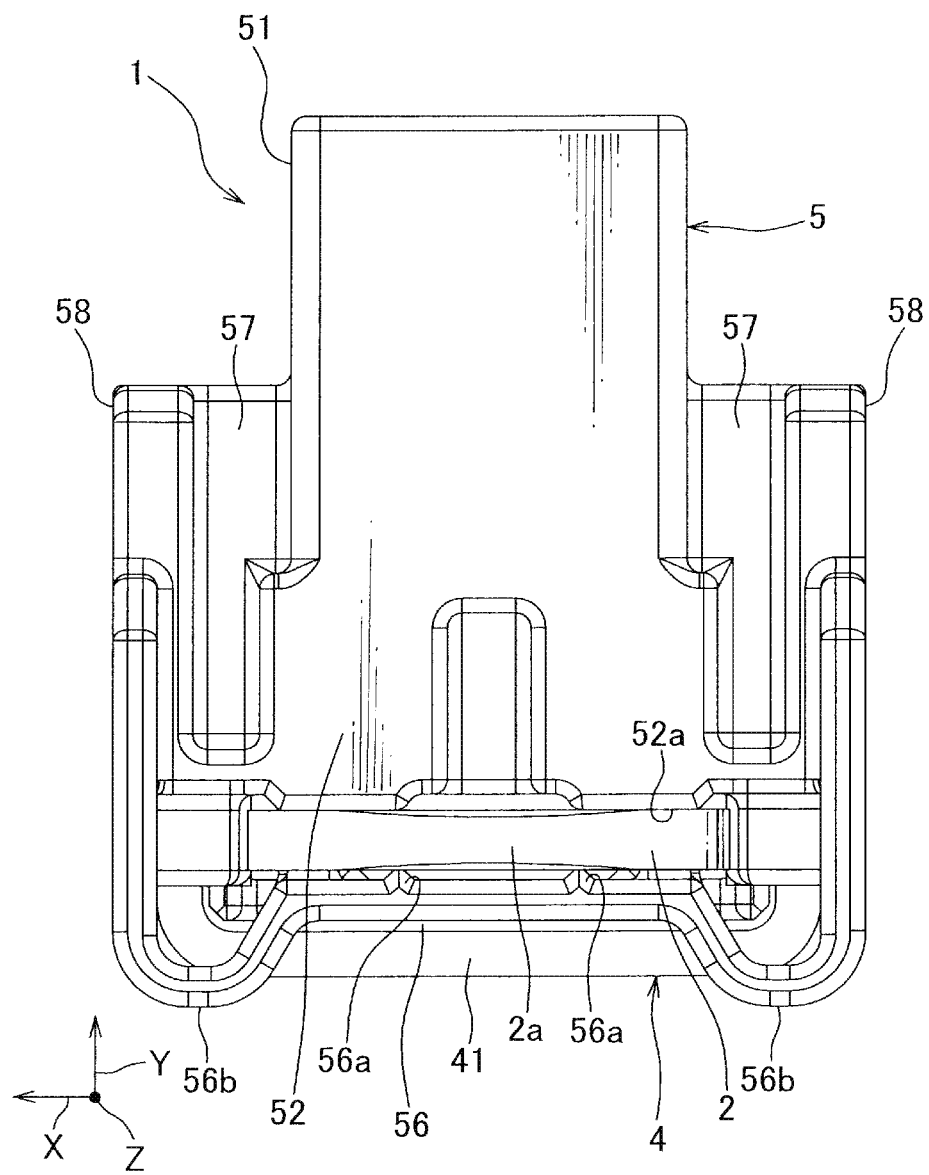
FIG. 6 is a front view of the current detection device of FIG. 1.

Like the above-described rib 55a, the rib 56a extends in the direction of the arrow Z, and has a triangular cross portion with a sharp peak. Further, the pair of ribs 56a is provided at the bridge portion 56. The pair of ribs 56a extends parallel to each other with a space therebetween in the arrow X direction. As shown in FIG. 6, the rib 56a is brought into contact with the lower face of the bus bar 2 inserted between the lower end 52a of the board accommodating portion 52 and the bridge portion 56, so as to press the bus bar 2 to the side of the lower end 52a of the board accommodating portion 52.

Figure 13:
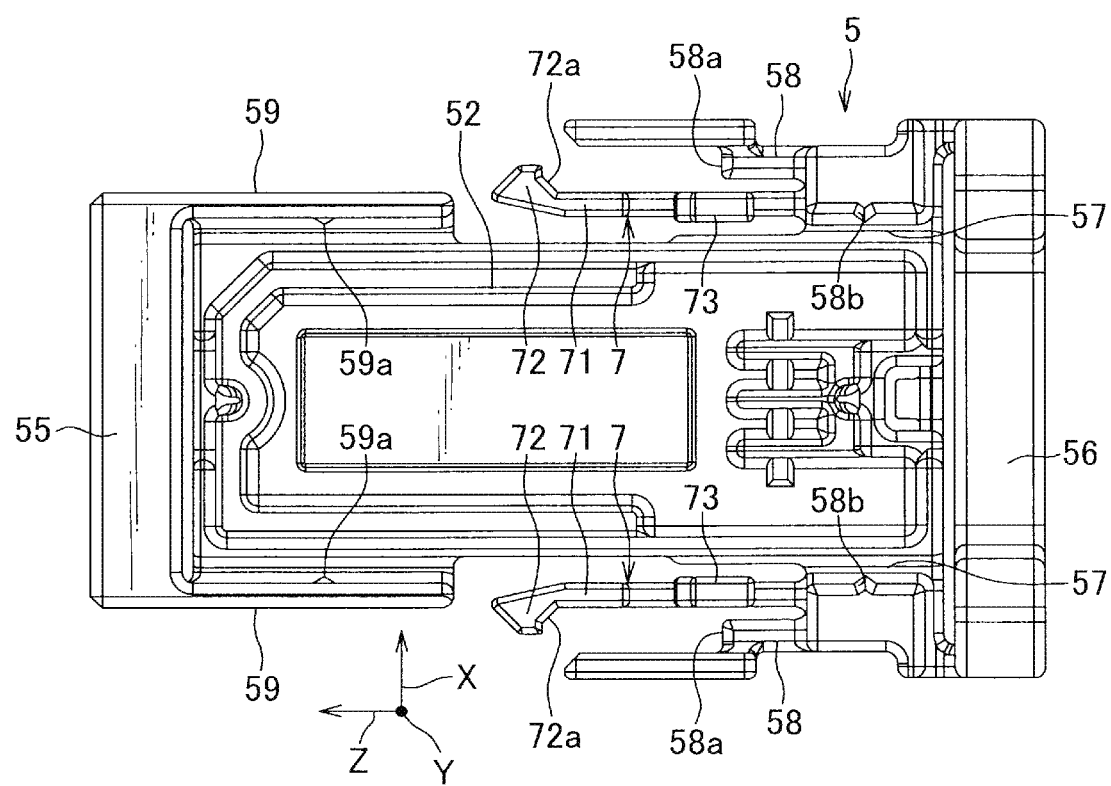
FIG. 13 is a bottom view of the housing of FIG. 12.

The above-described pair of walls 58 further extends downward than the lower end 52a of the side face opposed in the width direction of the board accommodating portion 52. The lower ends of the pair of walls 58 follow both side edges in the width direction of the bus bar 2. As shown in FIG. 13, the ribs 58b are provided one by one at the lower end portions of the pair of walls 58.

The rib 58b extends in the direction of the arrow Y and is formed in a triangular cross portion with a sharp peak. The pair of ribs 58b is in contact with both end faces in the width direction of the bus bar 2, respectively, and presses the bus bars 2. Further, when assembling the bus bar 2 to the housing 5, the bus bar 2 is, while crushing the tops of the pair of ribs 58b, passes between the pair of ribs 58b.

As shown in FIG. 13, the rib 59a is provided one by one at each of the lower end portions of the pair of rear end walls 59.

Like the above-described rib 58b, the rib 59a extends in the direction of the arrow Y, and has a triangular cross portion with a sharp peak. The pair of ribs 59a contacts both end faces of the bus bar 2 in the width direction, so as to press the bus bar 2, respectively. Further, the bus bar 2, at the time of assembling to the housing 5, while crushing the top portions of the pair of ribs 59a, passes between the pair of ribs 59a.

Figure 9:
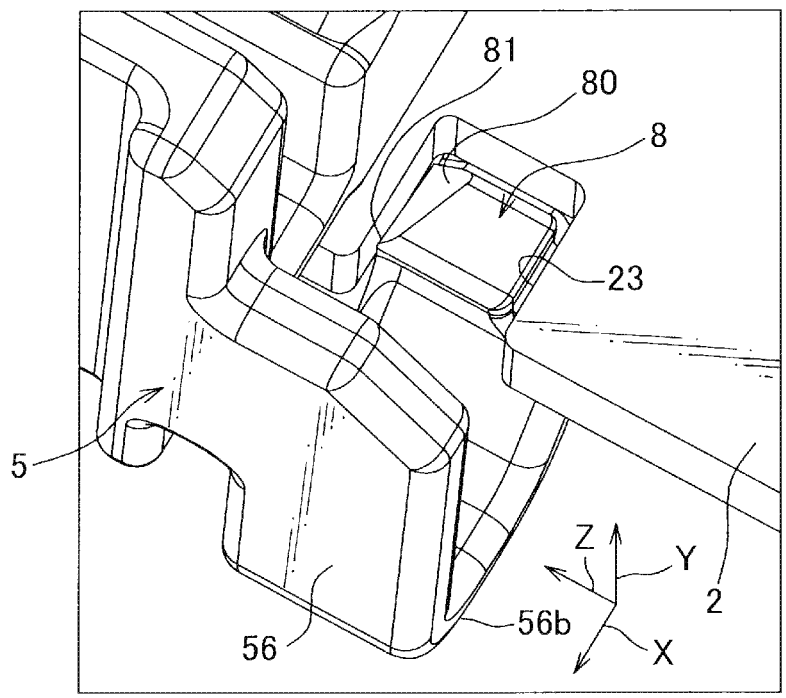
FIG. 9 is an enlarged view of part B in FIG. 2.
Figure 10:
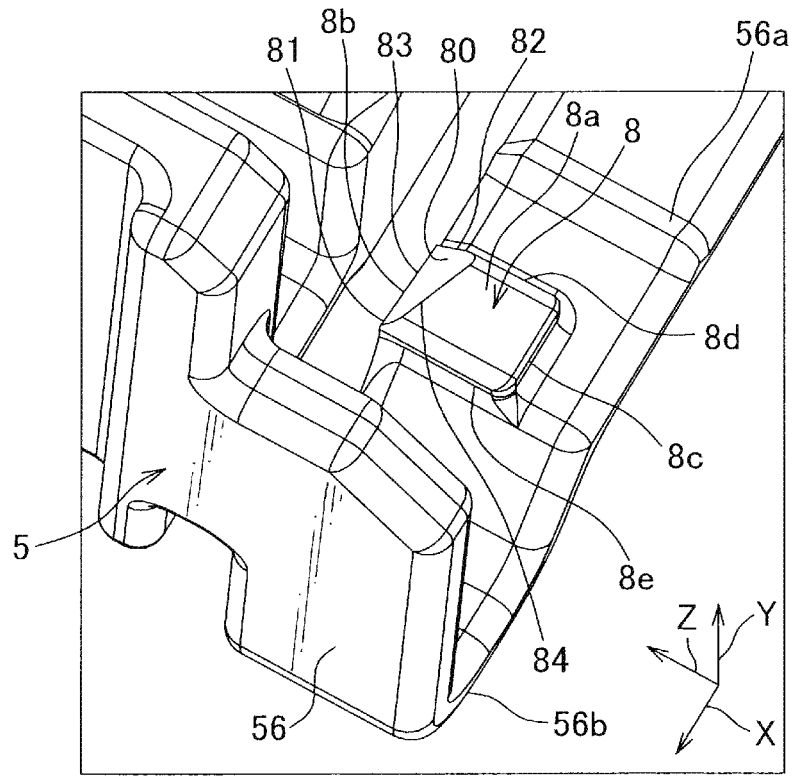
FIG. 10 is a view showing only the housing of FIG. 9.
Figure 12:
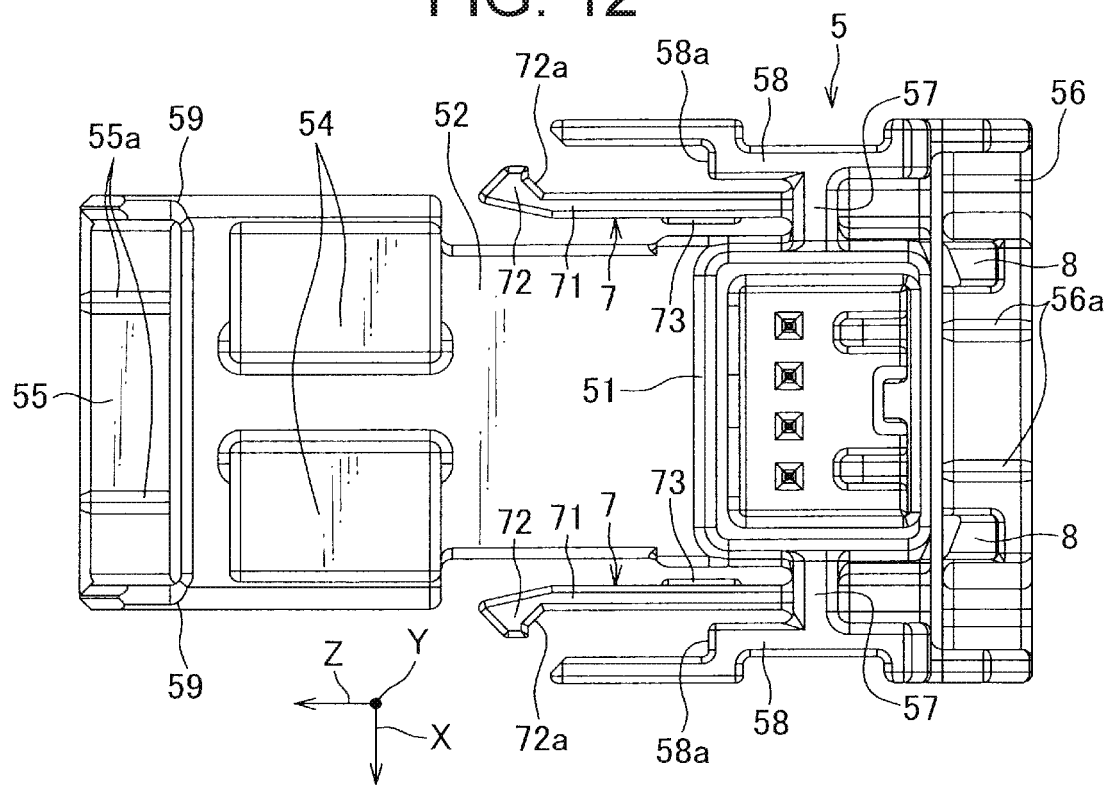
FIG. 12 is a plan view showing only the housing of FIG. 4.

A pair of retaining protrusions 8 (corresponding to "protrusions" of "retaining portion") is, as shown in FIG. 12, provided at the bridge portion 56. In addition, the pair of retaining protrusions 8 is disposed outside the rib 56a in the direction of the arrow X. The retaining protrusions 8 is, as shown in FIGS. 9 to 11, protrudes in the direction of the arrow Y from the bridging portion 56 which is elastically deformable in the direction of the arrow Y (which corresponds to "elastically deforming portion" of "retaining portion"), and is formed into a shape having a tapered face 80 on its rectangle body which fits into the cutout 23 of the bus bar 2.

At the rear end portion of the retaining protruding portion 8, the tapered face 80 is provide for improving the insertability of the bus bar 2 at the time of assembling the bus bar 2 to the housing 5. The tapered face 80 is formed in such manner that the inner corner portion of the rear end among the four corner portions of the retaining protruding portion 8 is cut away. The tapered face 80 is a triangle-shaped face in a plan view, and has three sides 82, 83, 84.

The side 82 is positioned on the inner side face 8d of the retaining protruding portion 8, and is inclined in a direction approaching the upper face 8a as going from the rear end face 8b toward the front end face 8c (in a direction away from the bridge portion 56). The side 83 is located on the rear end face 8b of the retaining protruding portion 8, and is inclined in a direction approaching the upper face 8a as going from the inner side 8d toward the outside face 8e. The side 84 is positioned on the upper face 8a of the stopper protrusion 8 and approaches the front end face 8c as directed from the outer face 8e to the inner face 8d. That is, the tapered face 80 is inclined in the direction approaching the upper face 8a as going from the rear end face 8b to the front end face 8c side, and also is inclined in the direction approaching the upper face 8a as going from the inner face 8d toward the outer face 8e.

When assembling the bus bar 2 to the housing 5, the front end face 2a slides on the tapered face 80, and slides forward as pushing down the retaining protrusion 8. At this time, because the front end face 2a of the bus bar 2 is formed in a circular shape in a plan view, that is, the front end face 2a of the bus bar 2 has chamfered corners, the front end face 2a, without abutting against the rear end face 8b of the retaining protrusion 8, hits the tapered face 80 and smoothly moves over the retaining protruding portion 8. Then, once the cutout 23 comes to the retaining protrusion 8, the pushed-down retaining protrusion 8 returns to its original height and fits into the cutout 23. As a result, the bus bar 2 is prevented from coming off in the direction of the arrow Z. Also, in a state in which the retaining protruding portion 8 is fitted in the cutout portion 23, an engaging margin for the cutout 23 is secured near the corner 81 outside the rear end of the retaining protruding portion 8, so that the bus bar 2 can be prevented to move to the front side.

In this embodiment, the front end face 2a of the bus bar 2 is formed in a circular shape in a plan view, but the end face 2a may have a shape in which corners are chamfered.

Further, in the present embodiment, in order to make it easier to bend when assembling the bus bar 2 to the housing 5, a curved portion 56b is provided on both sides of the pair of retaining protrusion 8 in the bridge portion 56 curved in a U shape such as to bulge downward.

As described above, the bus bar 2 is restricted to move by the four ribs 55a, 56a in the direction of the arrow Y, by the four ribs 58b, 59a in the direction of the arrow X, and by the restraining protruding portion 8 in the direction of the arrow Z. In the present embodiment, the cutout portion 23 is provided at both end portions in the width direction of the bus bar 2, but the cutout portion 23 may be provided only at one end portion or another end portion. In that case, the retaining protrusion 8 may be formed by one.

In fixing the bus bar 2 to the housing 5, the above-described current detection device 1 has no place for thermal welding, and can fix the bus bar 2 to the housing 5 only by assembling by the ribs 55a, 56a, 58b, 59a and the pair of retaining protruding portions 8. Therefore, it is unnecessary to prepare welding equipment, reducing the manufacturing cost. In addition, assembly man-hours can be reduced.

It should be noted that, in the case of such a structure that thermally welding of the retaining portion 351 as in the conventional current detection device 301, fixes the bus bar 302 to the housing 305, it is necessary to provide the retaining portion 351 for avoiding the magnetic member 304, causing the housing 305 to become larger in the longitudinal direction. In this respect, the current detection device 1 of the present embodiment eliminates the retaining portion 351, which makes it possible to suppress increase in size.

The current detection device according to the second embodiment of the present invention will be described with reference to FIGS. 15 to 23. In FIGS. 15 to 23, the same reference numerals are given to the same components as those of the first embodiment, and the explanation thereon will be omitted.

The current detection device 101 shown in FIGS. 15 to 23 includes the bus bar 2, a printed circuit board 30 on which two magnetic field detection elements 31, 32 mounted, a magnetic member 104, and a housing 105 holding these components while insulating them from each other.

The magnetic member 104 is configured as the same as the magnetic member 4 of the first embodiment except that a cutout portion 48 is provided on the front end face of the pair of standing wall portions 42, and a cutout portion 49 is provided on the rear end face.

The housing 105 is made of an insulating synthetic resin and integrally includes a board accommodating portion 52, a connector connecting portion 51, a magnetic member holding section, and a bus bar holding section.

The magnetic member holding section holds the magnetic member 104 in the X direction, the Y direction and the Z direction so as not to move in any direction. The magnetic member holding section has a pair of abutment faces 173 for respectively abutting against the cutout portion 48 of the pair of the wall portions 42, a pair of locking arms 107 for retaining the magnetic member 4, and a pair of pressing portions 154 for pressing the bottom plate portion 41 toward the lower end side of the pair of rear end walls 59.

Figure 20:
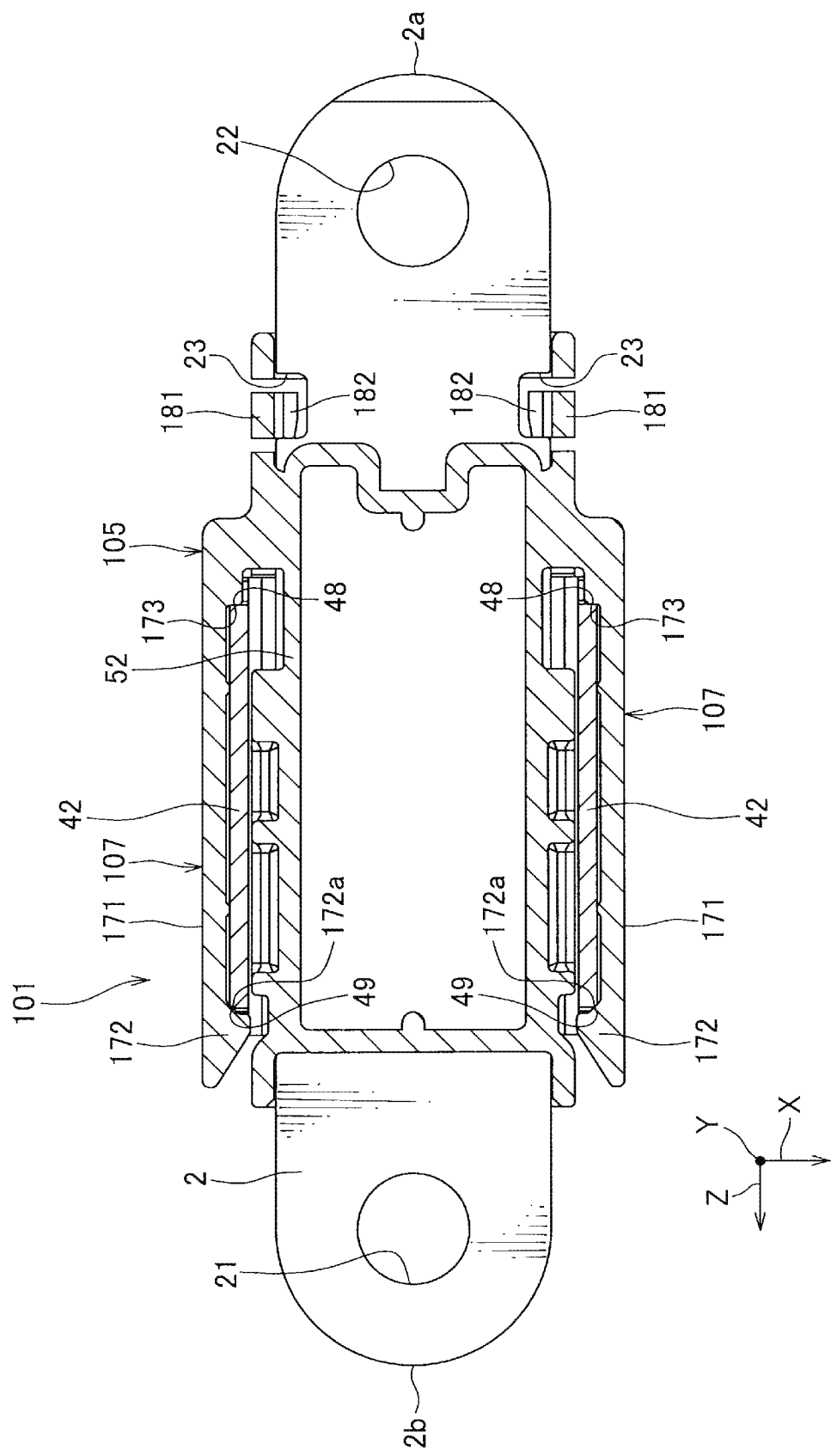
FIG. 20 is a cross-sectional view taken along the line E-E in FIG. 15.
Figure 21:
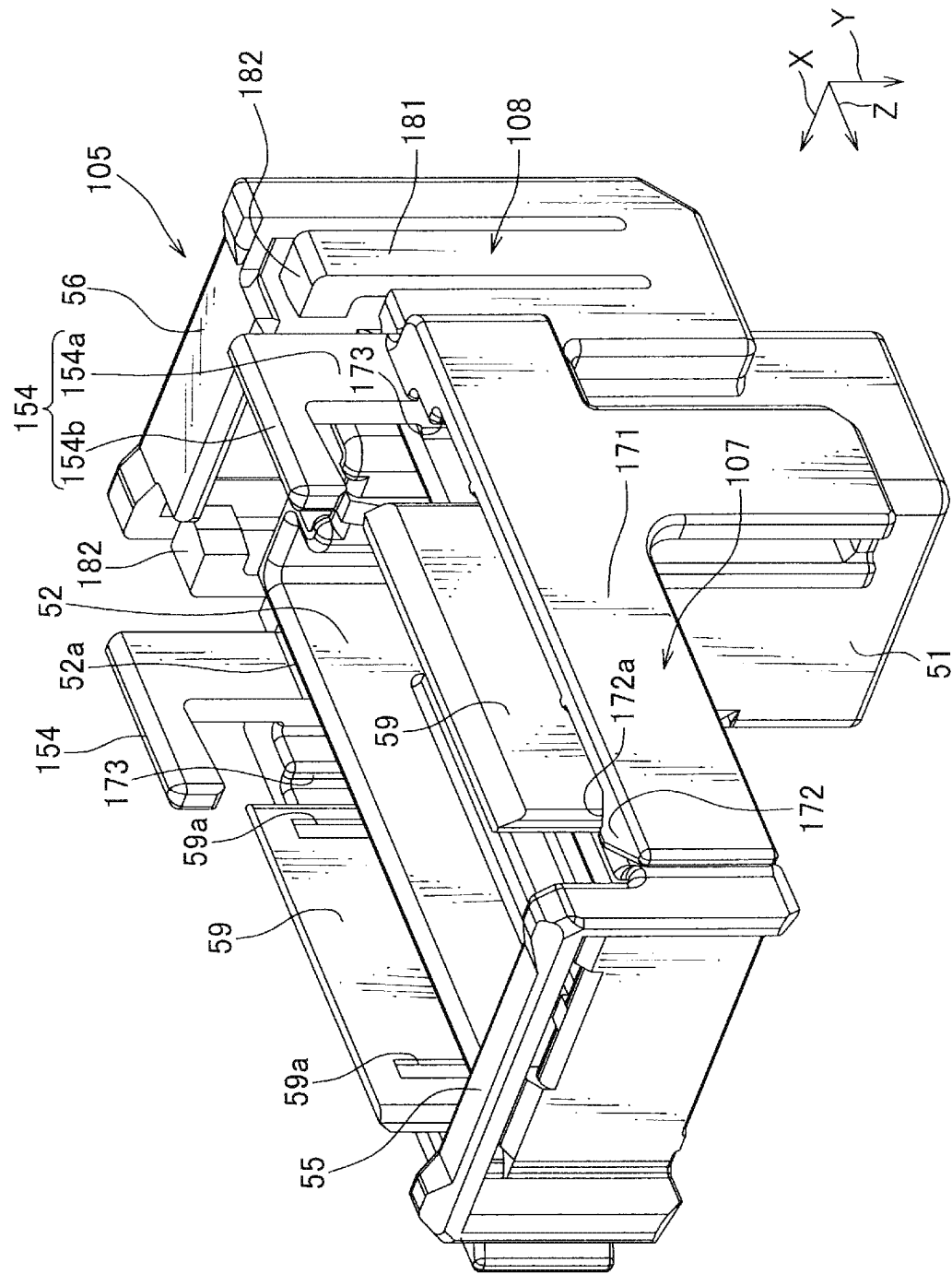
FIG. 21 is a perspective view showing only the housing of FIG. 16.
Figure 22:
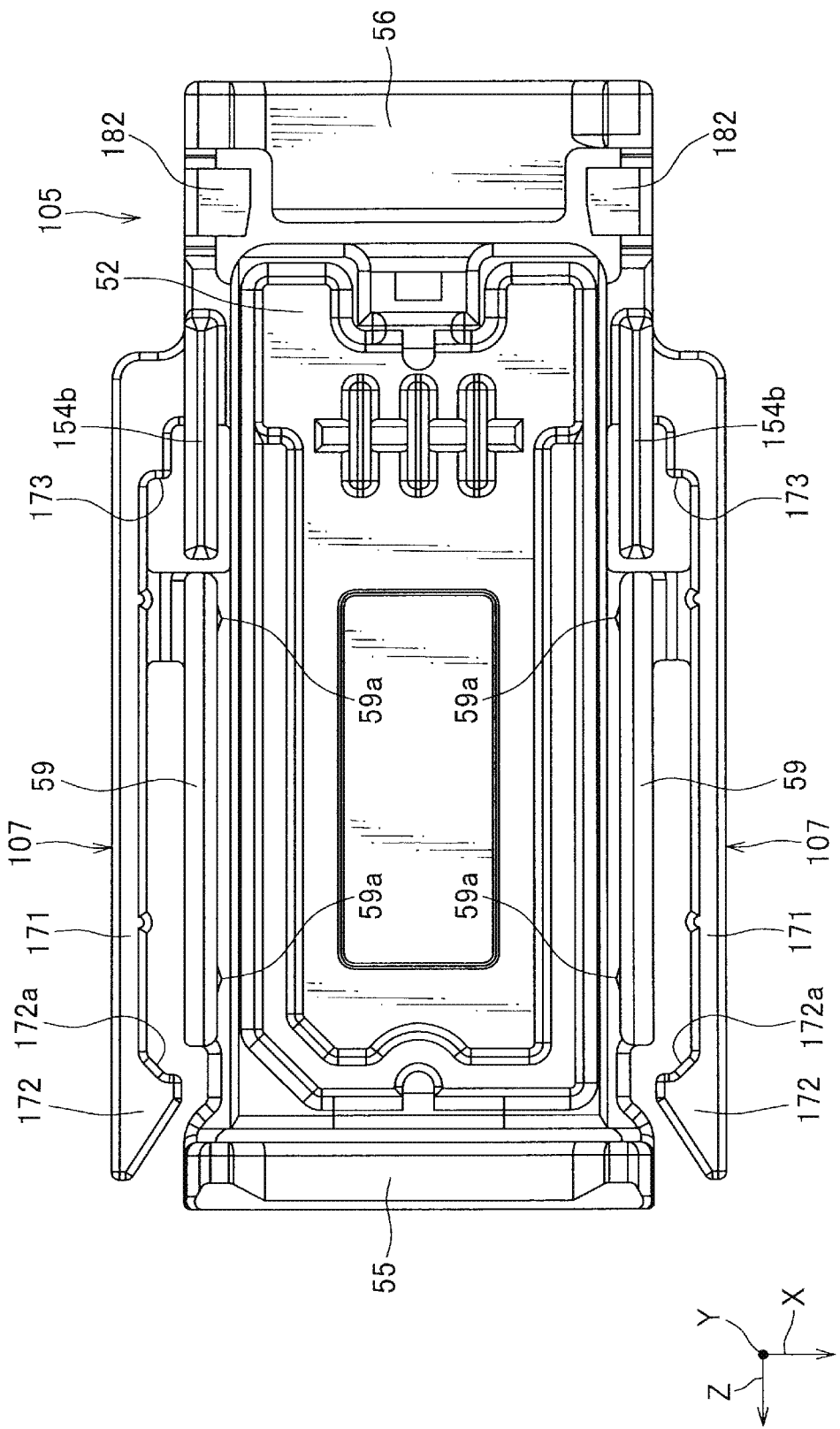
FIG. 22 is a bottom view of the housing of FIG. 21.

As shown in FIGS. 20 to 22, the pair of abutting faces 173 is formed at a fixed end of the pair of locking arms 107.

Figure 15:
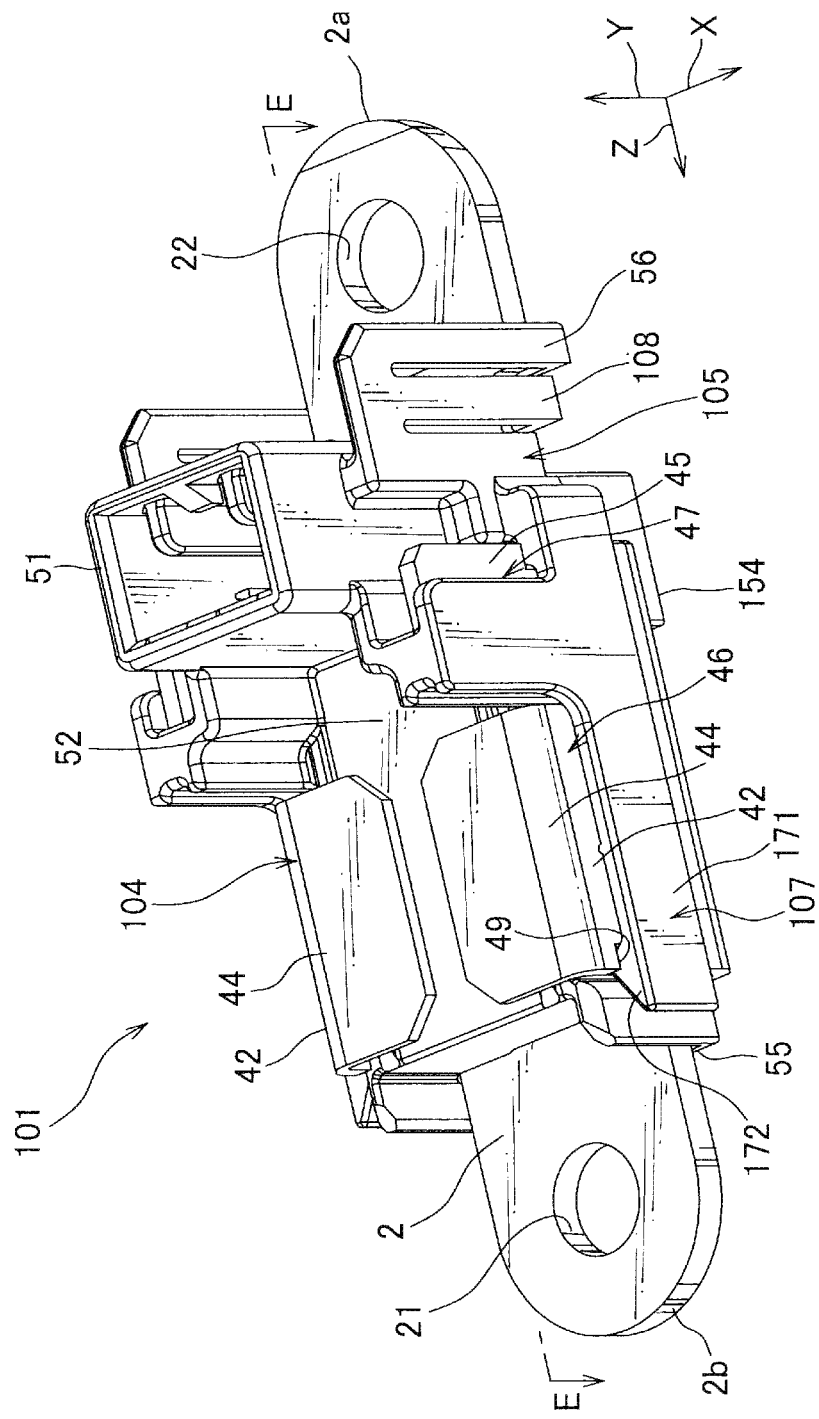
FIG. 15 is a perspective view of a current detection device according to a second embodiment of the present invention.
Figure 16:
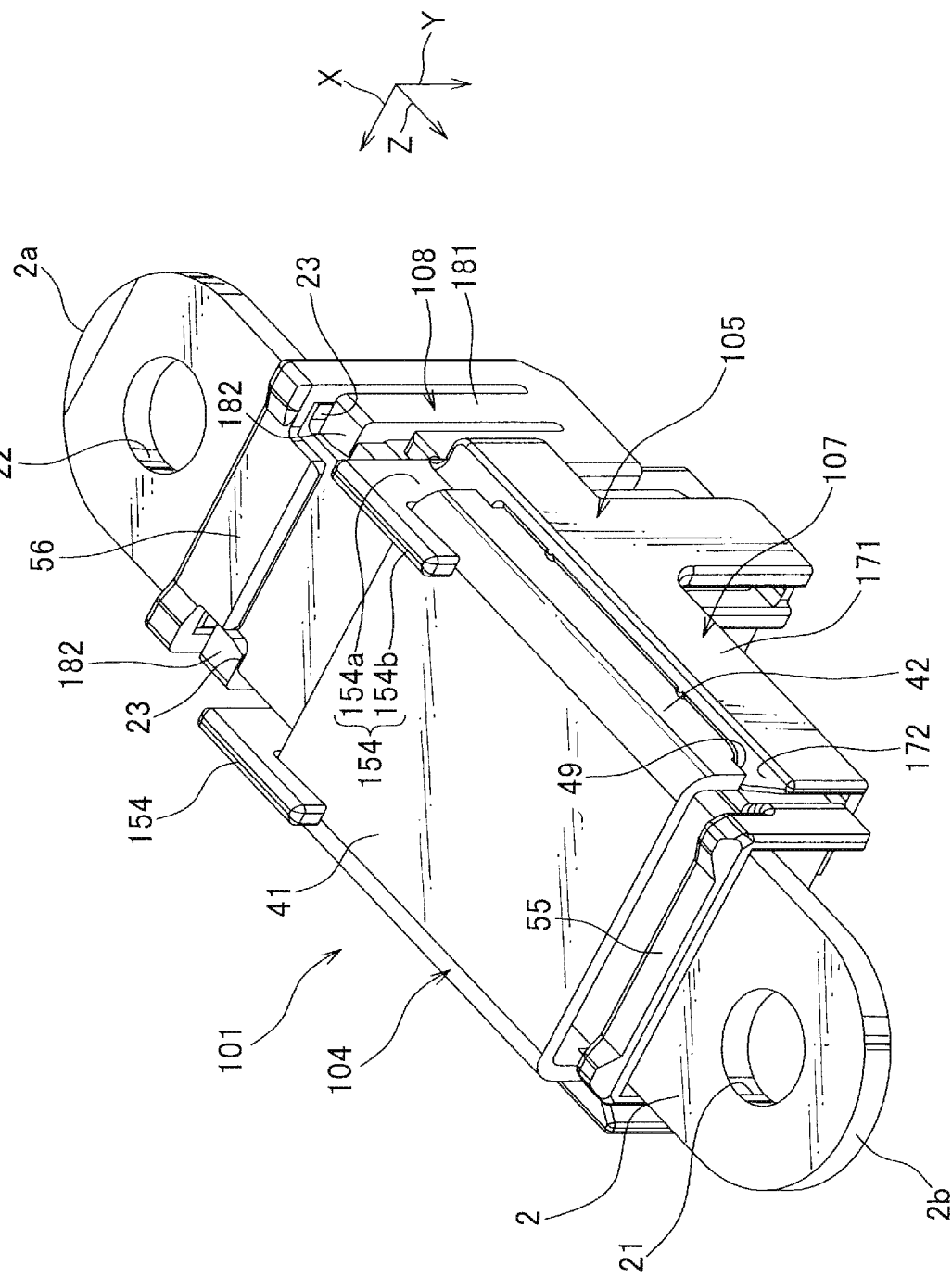
FIG. 16 is a perspective view of the current detection device of FIG. 15 as viewed from a bottom face side.

As shown in FIGS. 15 and 21 and the like, the pair of locking arms 107 respectively includes an arm portion 171 disposed at the outer side of the standing wall portion 42 and elastically deformable in the opposing direction of the standing wall portions 42, and a locking portion 172 protruding toward the inside of the housing 105 from the tip of the arm portion 171, and engaging with the cutout portion 49 of the standing wall portion 42.

Further, the locking portion 172 is provided with a contact face 172a forming an obtuse angle with the arm portion 171. The contact face 172a contacts the edge of the cutout portion 49, and presses the edge against the inner side in the width direction of the housing 105 and the side of the contact face 173 (front side), thereby holding the magnetic member 104 so as not to move with respect to the housing 105 in two directions of the X direction and the Z direction.

Figure 23:
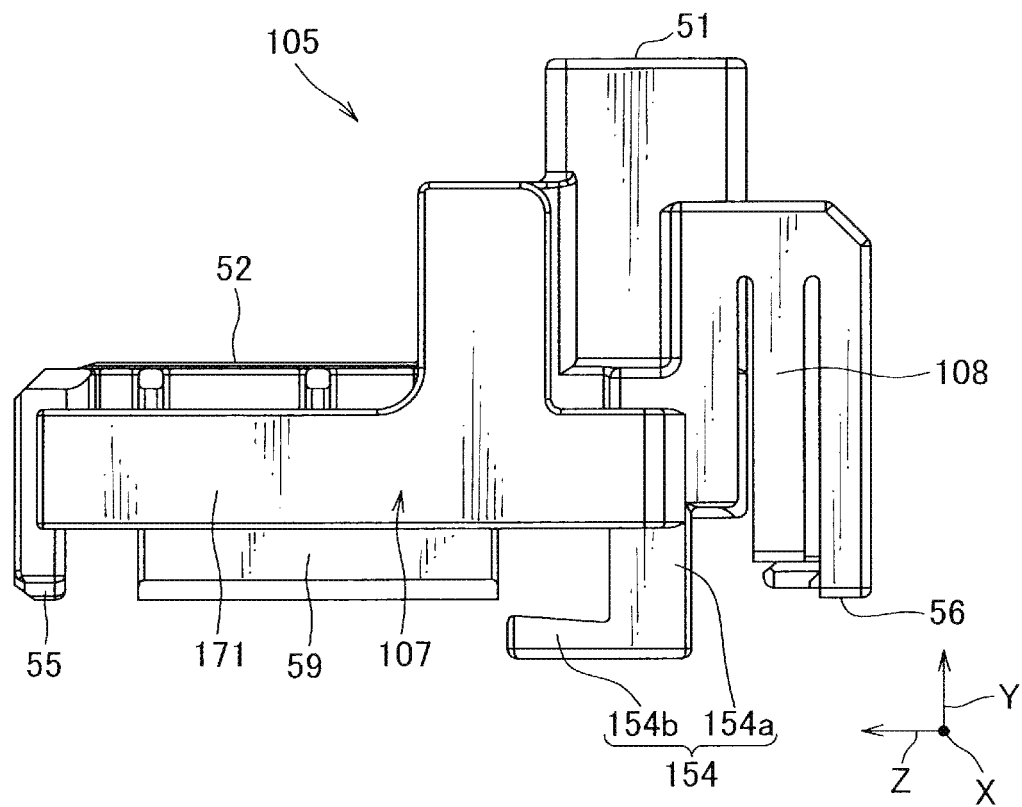
FIG. 23 is a side view of the housing of FIG. 21.
Figure 24:
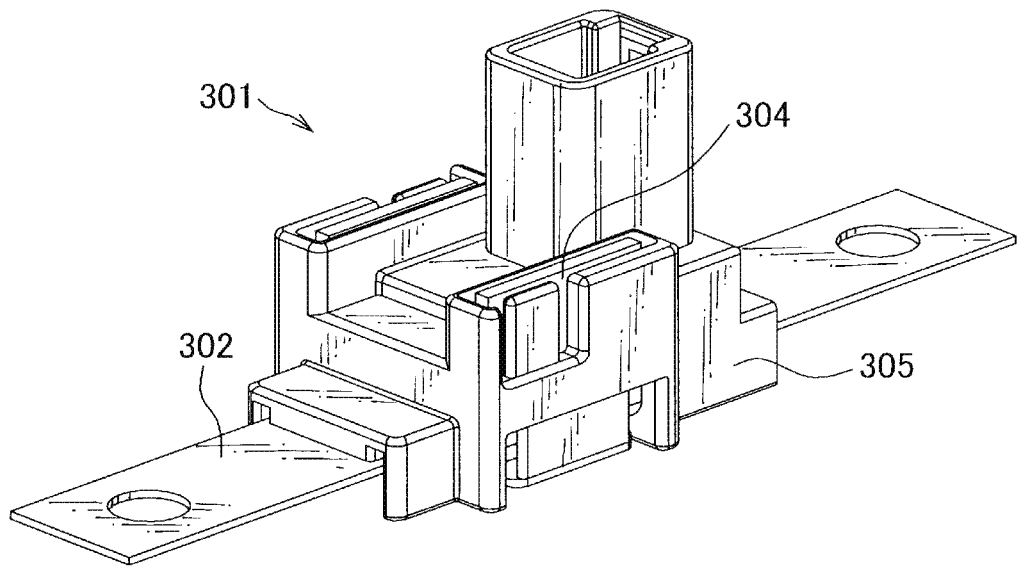
FIG. 24 is a perspective view of a conventional current detection device.
Figure 25:
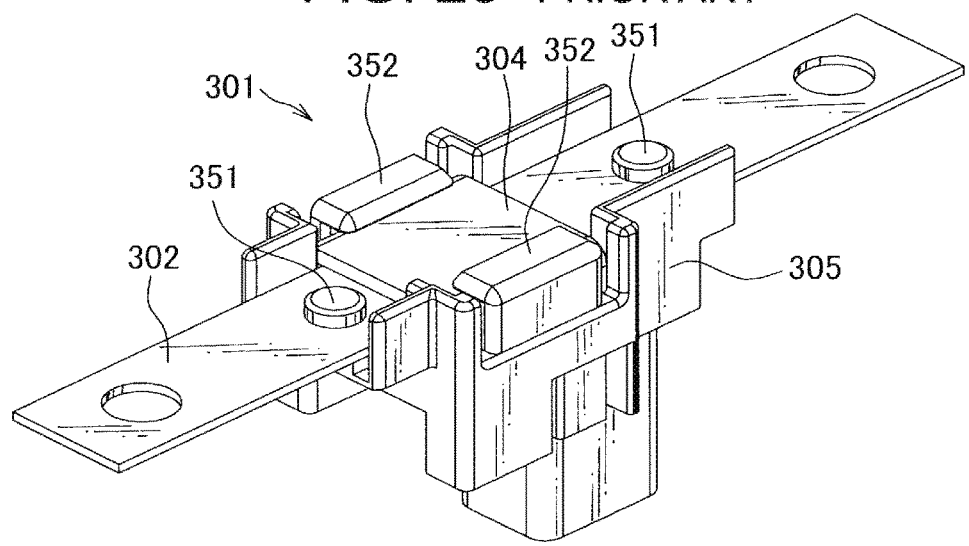
FIG. 25 is a perspective view of the current detection device of FIG. 24 as viewed from a bottom face side.
Figure 26:
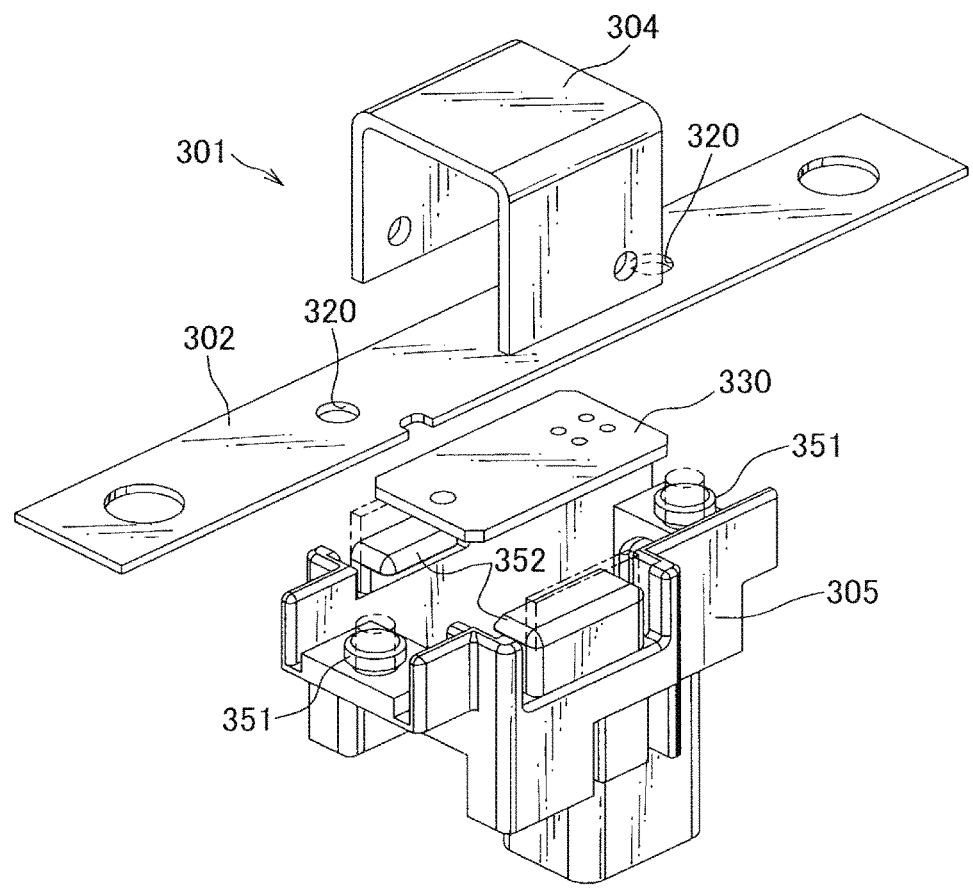
FIG. 26 is an exploded view of the current detection device of FIG. 25.

As shown in FIGS. 21 and 23, the pair of pressing portions 154 is respectively constituted by a base portion 154a descending from the lower end portion of the front side of the board accommodating portion 52, and a plate portion 154b extending rearward from the lower end of the base portion 154a. The plate portion 154b is formed so as to approach the board housing 52 as moves away from the base portion 154a. Such pressing portion 154 presses the bottom plate portion 41 positioned between the plate portion 154b and the lower end of the rear end wall 59 toward the lower end of the rear end wall 59 by the plate portion 154b, thereby holding the magnetic member 104 so as not to move with respect to the housing 105 in the Y direction.

Figure 17:
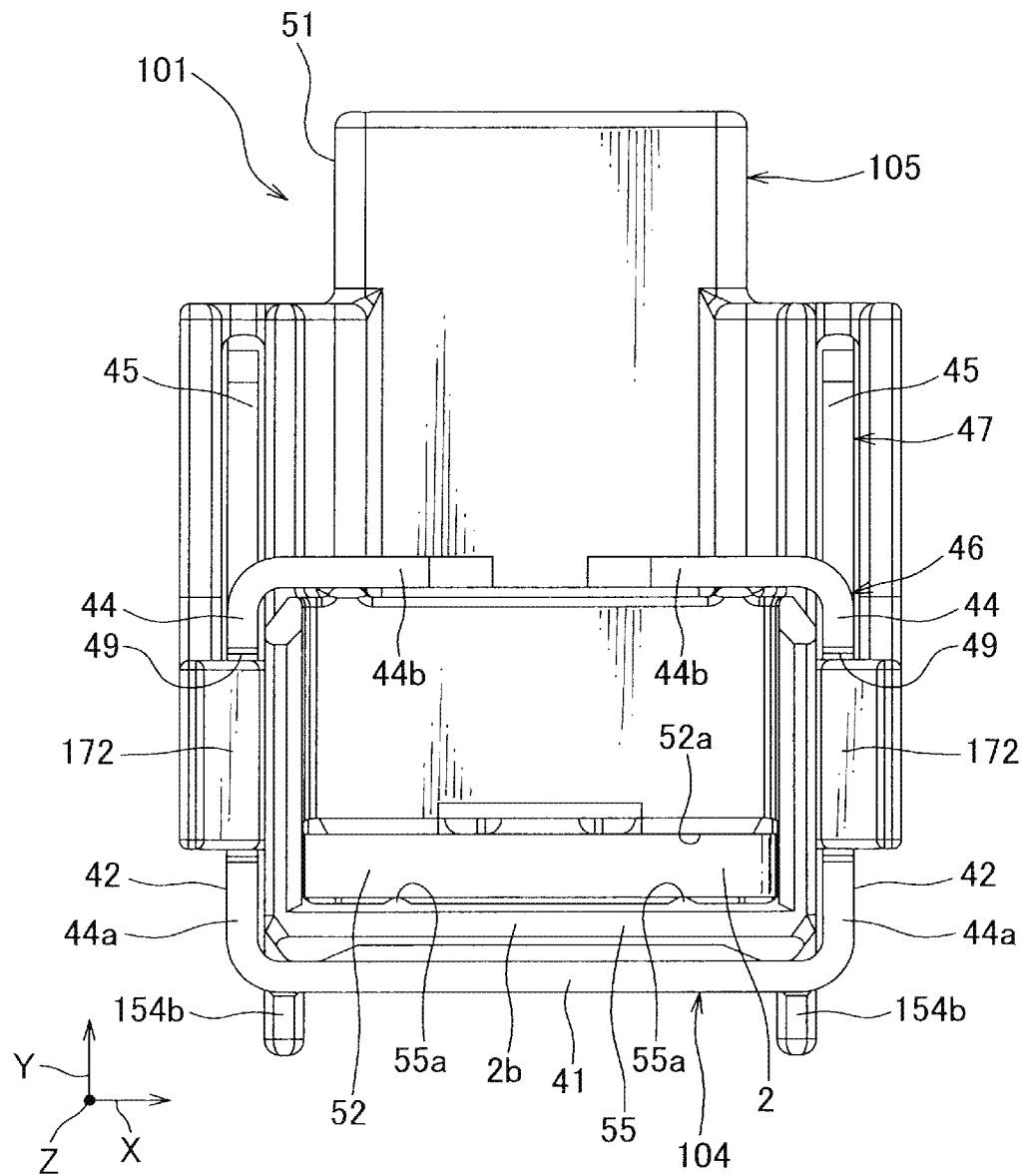
FIG. 17 is a rear view of the current detection device of FIG. 15.
Figure 18:
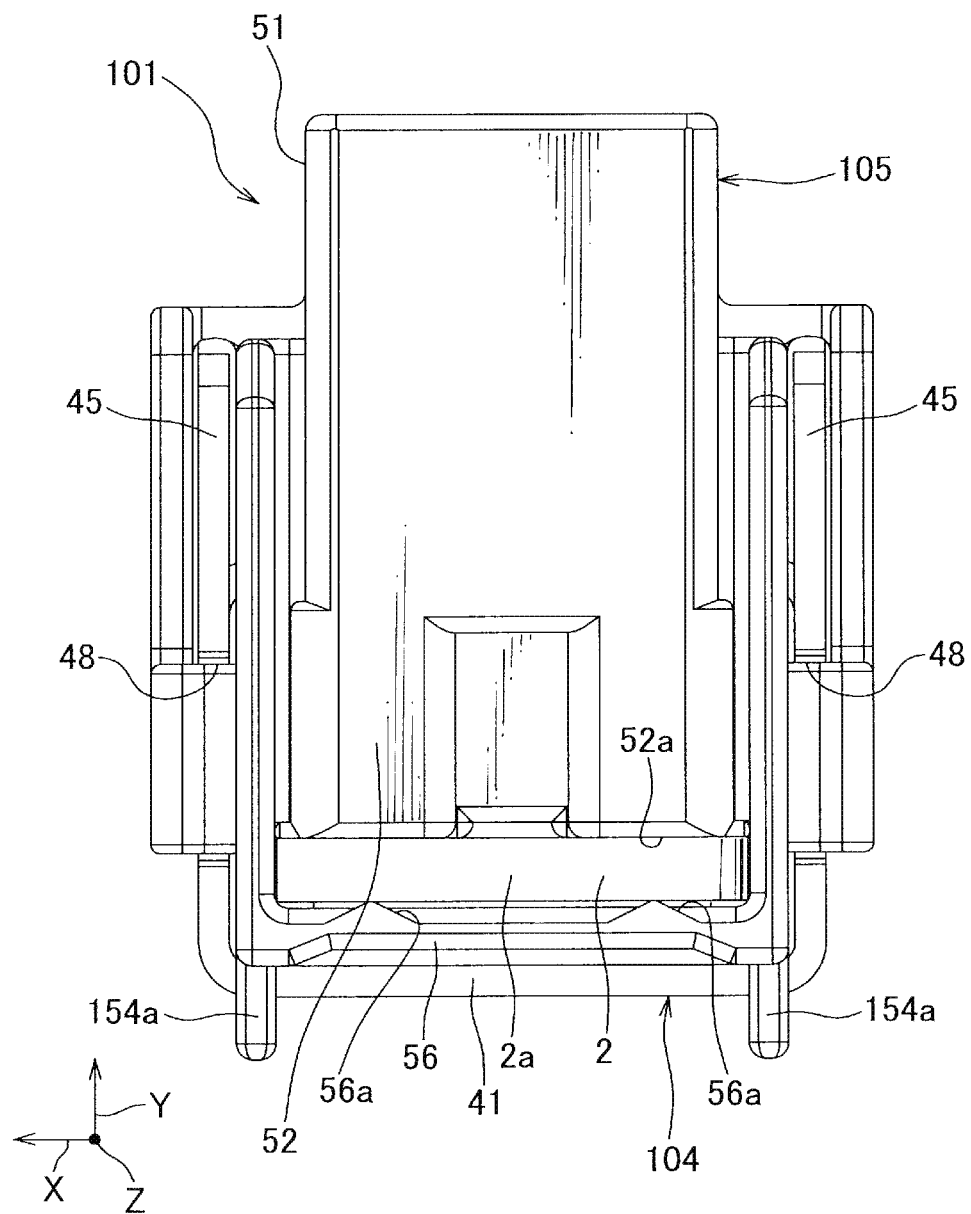
FIG. 18 is a front view of the current detection device of FIG. 15.
Figure 19:
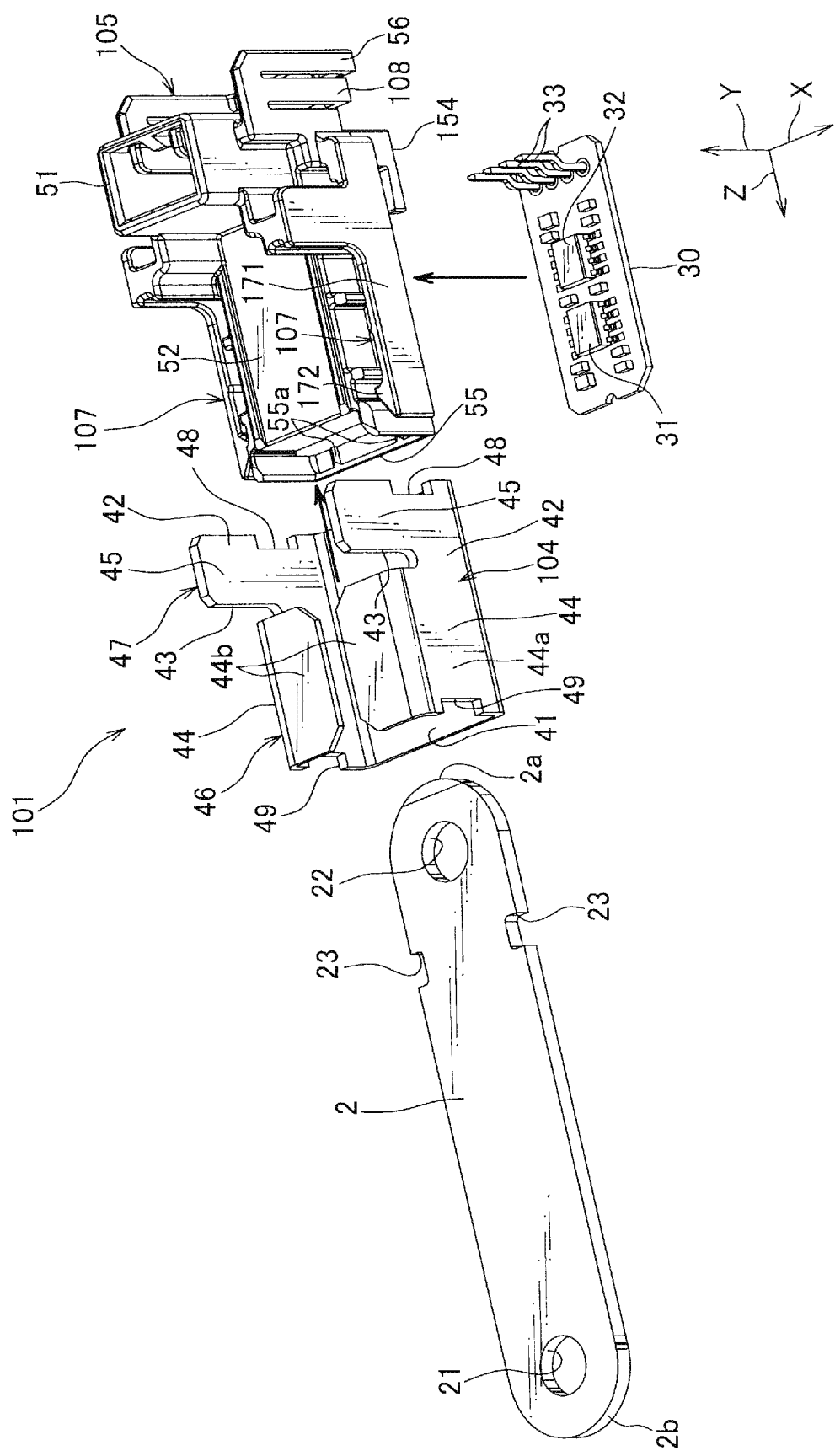
FIG. 19 is an exploded view of the current detection device of FIG. 15.

The bus bar holding section holds the bus bar 2 in the X direction, the Y direction and the Z direction with respect to the housing 105 so as not to move to either direction. The bus bar holding section is, as shown in FIGS. 17, 18 and 22, provided with eight ribs 55a, 56a, 59a for pressing the lower face and the side end face of the bus bar 2, and a pair of locking claws 108 (corresponding to the "retaining portion") respectively engaging with the cutout portions 23 provided at both end portions in the width direction of the bus bar 2.

As shown in FIGS. 21 and 22, the rib 59a is provided in tows at each of the lower end portions of the pair of rear end walls 59.

The pair of lock pawls 108 is provided with an arm portion 181 hanging downward in the direction of the arrow Y and elastically deformable in the direction of the arrow X, and a locking portion 182 protruding from the lower end of the arm portion 181 toward the inside of the housing 105 and fitted in the cutout portion 23 of the bus bar 2.

As described above, in the bus bar 2a, the movement of in the direction of the arrow Y is restricted by the four ribs 55a, 56a, the movement in the direction of the arrow X by the four ribs 59a, and the retaining in the direction of the arrow Z by the pair of lock claws 108.

The above-described current detection device 101, in fixing the bus bar 2 to the housing 105, has no place to be thermally welded, and due to the ribs 55a, 56a, 59a and the pair of lock claws 108 can fix the bus bar 2 to the housing 105 only by assembling. Therefore, the installation facility is unnecessary, and the manufacturing cost can be reduced. In addition, assembly man-hours can be reduced.

It is to be noted that the above-described embodiment merely shows a representative form of the present invention, the present invention is not limited to this embodiment. That is, various modifications are made within the scope not deviating from the gist of the present invention. As long as the configuration of the present invention is still provided by such deformation, it goes without saying that the deformation is included in the scope of the invention.

DESCRIPTION OF SYMBOLS 1,101 current detection device
2 bus bar
4,104 magnetic member
5, 105 housing
8 retaining protruding portion (retaining portion)
31, 32 magnetic field detecting element
55a, 56a rib
58b, 59a rib
108 lock claw (retaining portion)

The invention claimed is:

1. A current detection device, comprising:
   a plate-like bus bar having a flat shape along an entire length thereof;
   a magnetic field detecting element for detecting a magnetic field generated by a current flowing through the bus bar;
   a magnetic member; and
   a housing holding the bus bar, the magnetic field detecting element, and the magnetic member, wherein
   the housing includes a first rib configured to press the bus bar to restrict a movement in a thickness direction of the bus bar, a second rib configured to press the bus bar to restrict a movement in a width direction of the bus bar, and a retaining portion configured to retain the bus bar in a longitudinal direction of the bus bar by engaging with the bus bar.

2. The current detection device according to claim 1, wherein the second rib is configured to press a flat portion of the bus bar to restrict the movement in the width direction of the bus bar.

3. The current detection device according to claim 1, wherein the retaining portion is configured to engage with a cutout portion formed in a flat portion of the bus bar.

4. A current detection device, comprising:
   a plate-like bus bar;
   a magnetic field detecting element for detecting a magnetic field generated by a current flowing through the bus bar;
   a magnetic member; and
   a housing holding the bus bar, the magnetic field detecting element, and the magnetic member, wherein
   the housing includes a first rib configured to press the bus bar to restrict a movement in a thickness direction of the bus bar, a second rib configured to press the bus bar to restrict a movement in a width direction of the bus bar, and a retaining portion configured to retain the bus bar in a longitudinal direction of the bus bar by engaging with the bus bar, wherein
   a cutout portion is provided at one end portion or both end portions of the bus bar in the width direction of the bus bar,
   the retaining portion includes an elastically deformable portion elastically deformable in the thickness direction of the bus bar, and a protrusion protruding in the thickness direction of the bus bar from the elastically deformable portion and configured to fit into the cutout portion, the protrusion is provided with a tapered face on which a front end face of the bus bar slides when assembling the bus bar to the housing, and
   the tapered face is inclined in a direction away from the elastically deformable portion as approaching from a rear end face side to a front end face side of the bus bar, and is inclined in the direction away from the elastically deformable portion as approaching from an inside to an outside of the bus bar in the width direction of the bus bar.

5. The current detection device according to claim 4, wherein the front end face of the bus bar is formed in a semicircular shape in a plan view.

* * * * *